(12) United States Patent
Iiyama et al.

(10) Patent No.: US 8,508,688 B2
(45) Date of Patent: Aug. 13, 2013

(54) ILLUMINATING LENS, LIGHTING DEVICE, SURFACE LIGHT SOURCE, AND LIQUID-CRYSTAL DISPLAY APPARATUS

(75) Inventors: Tomoko Iiyama, Osaka (JP); Syunsuke Kimura, Hyogo (JP); Daizaburo Matsuki, Osaka (JP)

(73) Assignee: Panasonic Corporation, Osaka (JP)

( * ) Notice: Subject to any disclaimer, the term of this patent is extended or adjusted under 35 U.S.C. 154(b) by 554 days.

(21) Appl. No.: 12/720,249

(22) Filed: Mar. 9, 2010

(65) Prior Publication Data
US 2010/0201911 A1 Aug. 12, 2010

Related U.S. Application Data

(63) Continuation-in-part of application No. PCT/JP2009/003947, filed on Aug. 19, 2009.

(30) Foreign Application Priority Data

Feb. 12, 2009 (JP) .................................. 2009-029350

(51) Int. Cl.
*G02F 1/1335* (2006.01)
(52) U.S. Cl.
USPC ............................................... 349/61; 349/62
(58) Field of Classification Search
None
See application file for complete search history.

(56) References Cited

U.S. PATENT DOCUMENTS

| | | | |
|---|---|---|---|
| 7,153,002 B2 | 12/2006 | Kim et al. | |
| 7,348,723 B2 | 3/2008 | Yamaguchi et al. | |
| 7,474,475 B2 | 1/2009 | Paek et al. | |
| 7,602,559 B2 | 10/2009 | Jang et al. | |
| 8,075,157 B2 | 12/2011 | Zhang et al. | |
| 2004/0246606 A1 | 12/2004 | Benitez et al. | |
| 2004/0257826 A1 | 12/2004 | Tatsukawa | |
| 2005/0243577 A1 | 11/2005 | Moon | |
| 2006/0109669 A1 | 5/2006 | Tanaka et al. | |
| 2006/0119250 A1 | 6/2006 | Suehiro et al. | |
| 2006/0126343 A1 | 6/2006 | Hsieh et al. | |
| 2006/0152932 A1 | 7/2006 | Wu | |
| 2006/0239020 A1 | 10/2006 | Albou | |
| 2007/0029563 A1 | 2/2007 | Amano et al. | |

(Continued)

FOREIGN PATENT DOCUMENTS

| | | |
|---|---|---|
| JP | 2004-087411 A | 3/2004 |
| JP | 2005-011704 | 1/2005 |

(Continued)

OTHER PUBLICATIONS

Co-pending U.S. Appl. No. 12/704,813, filed Feb. 12, 2010.

(Continued)

*Primary Examiner* — Thanh-Nhan P Nguyen
(74) *Attorney, Agent, or Firm* — Hamre, Schumann, Mueller & Larson, P.C.

(57) ABSTRACT

An illuminating lens has a light entrance surface and a light exit surface. The light exit surface has a first light exit surface recessed toward a point on an optical axis A and a second light exit surface extending outwardly from the periphery of the first light exit surface. The first light exit surface includes a transmissive region located in the center of the first light exit surface and a total reflection region located around the transmissive region. The transmissive region transmits light that has been emitted from a starting point Q, which is the position of a light source on the optical axis A, at a relatively small angle with respect to the optical axis A. The total reflection region totally reflects light that has been emitted from the starting point Q at a relatively large angle with respect to the optical axis A.

14 Claims, 21 Drawing Sheets

(56) References Cited

U.S. PATENT DOCUMENTS

| | | |
|---|---|---|
| 2007/0047232 A1 | 3/2007 | Kim et al. |
| 2007/0070530 A1 | 3/2007 | Seo et al. |
| 2007/0263390 A1 | 11/2007 | Timinger et al. |
| 2008/0007673 A1 | 1/2008 | Shiraishi et al. |
| 2008/0100773 A1 | 5/2008 | Hwang et al. |
| 2008/0174996 A1 | 7/2008 | Lu et al. |
| 2008/0278655 A1 | 11/2008 | Moon et al. |
| 2008/0303757 A1 | 12/2008 | Ohkawa et al. |
| 2009/0052193 A1 | 2/2009 | Zweig et al. |
| 2009/0109687 A1 | 4/2009 | Householder et al. |
| 2009/0268469 A1 | 10/2009 | Huang et al. |
| 2009/0273727 A1 | 11/2009 | Kubota et al. |
| 2010/0020264 A1 | 1/2010 | Ohkawa |
| 2010/0053973 A1 | 3/2010 | Shastry et al. |
| 2010/0195335 A1 | 8/2010 | Allen et al. |

FOREIGN PATENT DOCUMENTS

| | | |
|---|---|---|
| JP | 2005-317977 A | 11/2005 |
| JP | 2006-005791 A | 1/2006 |
| JP | 2006-113556 A | 4/2006 |
| JP | 2006-147448 | 6/2006 |
| JP | 2006-252841 A | 9/2006 |
| JP | 2006-309242 A | 11/2006 |
| JP | 3875247 B2 | 11/2006 |
| JP | 2007-026702 | 2/2007 |
| JP | 2007-034307 A | 2/2007 |
| JP | 2007-048775 A | 2/2007 |
| JP | 2007-096318 A | 4/2007 |
| JP | 2007-102139 A | 4/2007 |
| JP | 2007-287479 | 11/2007 |
| JP | 2008-015288 | 1/2008 |
| JP | 2008-305923 A | 12/2008 |
| KR | 10-2006-0040502 | 5/2006 |
| WO | 2007/021149 | 2/2007 |

OTHER PUBLICATIONS

Co-pending U.S. Appl. No. 12/704,926, filed Feb. 12, 2010.
Co-pending U.S. Appl. No. 12/705,016, filed Feb. 12, 2010.
Co-pending U.S. Appl. No. 12/705,076, filed Feb. 12, 2010.

ILLUMINATING LENS, LIGHTING DEVICE, SURFACE LIGHT SOURCE, AND LIQUID-CRYSTAL DISPLAY APPARATUS

BACKGROUND OF THE INVENTION

1. Field of the Invention

The present invention relates to an illuminating lens for widening a range of transmission directions for light from a light source such as a light emitting diode, and to a lighting device using this illuminating lens. The present invention further relates to a surface light source including a plurality of lighting devices, and to a liquid-crystal display apparatus in which this surface light source is disposed behind a liquid-crystal panel to serve as a backlight.

2. Description of Related Art

In a conventional backlight of a large-sized liquid-crystal display apparatus, a number of cold cathode tubes are disposed immediately below a liquid-crystal panel, and these cold cathode tubes are used with other members such as a diffusing plate and a reflecting plate. In recent years, light emitting diodes have been used as light sources for backlights. Light emitting diodes have increased their efficiency recently, and are expected to serve as low-power light sources to replace fluorescent lamps. In the case where light emitting diodes are used as a light source in a liquid-crystal display apparatus, the power consumption of the apparatus can be reduced by controlling the light and dark states of the light emitting diodes according to an image to be displayed.

In a backlight of a liquid-crystal display apparatus using light emitting diodes as a light source, a large number of light emitting diodes are disposed therein instead of cold cathode tubes. The use of a large number of light emitting diodes allows the entire surface of the backlight to have uniform brightness, but the need for such a large number of light emitting diodes is an obstacle to cost reduction. In view of this, attempts to increase the output power of each light emitting diode to reduce the required number of light emitting diodes have been made. For example, Japanese Patent No. 3875247 has proposed a lens that is designed to provide a uniform surface light source with a reduced number of light emitting diodes.

In order to obtain a uniform surface light source with a reduced number of light emitting diodes, the area to be irradiated with the light emitted from each light emitting diode needs to be increased. That is, light emitted from each light emitting diode needs to be spread to obtain a wider range of transmission directions for light from the diode. For this purpose, in Japanese Patent No. 3875247, a lens having a circular shape in a plan view is disposed on a light emitting diode as a chip to control the directivity of the chip. The light exit surface of this lens, through which light exits the lens, has a shape such that a portion in the vicinity of the optical axis is a concave and a portion surrounding the concave is a convex extending continuously from the concave.

A light emitting diode as a chip emits light mostly in the front direction of the light emitting diode chip. In the lens disclosed in Japanese Patent No. 3875247, light that has been emitted in the front direction of the chip is refracted at the concave surface in the vicinity of the optical axis and diffused. As a result, the surface to be irradiated is illuminated to have a wide illuminance distribution with a reduced illuminance in the vicinity of the optical axis.

In the lens disclosed in Japanese Patent No. 3875247, however, the light emitted from the light source needs to be refracted, and therefore the difference in height between the concave and the convex must be reduced to a certain level.

SUMMARY OF THE INVENTION

It is an object of the present invention to provide an illuminating lens capable of further widening the range of transmission directions for light from a light source, and to provide a lighting device, a surface light source, and a liquid-crystal display apparatus each including this illuminating lens.

In order to achieve the above object, the present inventors have considered it important, in obtaining a wider range of transmission directions for light from a light source, to distribute radially the intense light that has been emitted in the front direction of the light emitting diode chip, and come up with an idea of distributing radially the light emitted in the front direction of the light emitting diode chip by utilizing intentionally the total reflection of the light. The present invention has been made in view of the above circumstances.

The present invention provides an illuminating lens for spreading light emitted from a light source so that a surface to be irradiated is irradiated with the spread light. The lens includes: a light entrance surface through which the light emitted from the light source enters the lens; and a light exit surface through which the light that has entered the lens exits the lens. In this illuminating lens, the light exit surface has a first light exit surface and a second light exit surface. The first light exit surface is recessed toward a point on an optical axis of the illuminating lens, and the second light exit surface extends outwardly from a periphery of the first light exit surface to form a convex. The first light exit surface has a transmissive region located in the center of the first light exit surface and a total reflection region located around the transmissive region. The transmissive region transmits light that has been emitted from a starting point at a relatively small angle with respect to the optical axis and then reached the first light exit surface, when a position of the light source on the optical axis is defined as the starting point. The total reflection region totally reflects light that has been emitted from the starting point at a relatively large angle with respect to the optical axis and then reached the first light exit surface. The second light exit surface has a shape capable of transmitting approximately the entire amount of light that has been emitted from the starting point and then reached the second light exit surface.

Herein, "approximately the entire amount" means at least 90% of the entire amount. It may be the entire amount, and may be an amount slightly smaller than the entire amount.

The present invention also provides a lighting device including: a light emitting diode for emitting light; and an illuminating lens for spreading light emitted from the light emitting diode so that a surface to be irradiated is irradiated with the spread light. This illuminating lens is the above-mentioned illuminating lens.

The present invention further provides a surface light source including: a plurality of lighting devices arranged in a plane; and a diffusing plate disposed to cover the plurality of lighting devices, and configured to receive on one surface thereof light emitted from the plurality of lighting devices and to emit the light from the other surface thereof in a diffused manner. Each of the plurality of lighting devices is the above-mentioned lighting device.

The present invention still further provides a liquid-crystal display apparatus including: a liquid-crystal panel; and the above-mentioned surface light source disposed behind the liquid-crystal panel.

In the illuminating lens configured as described above, the most part of the light that has been emitted from the light source and reached the transmissive region located in the center of the first light exit surface is refracted at the transmissive region, and thus the area surrounding the optical axis of the lens on the surface to be irradiated is irradiated with the refracted light. On the other hand, the most part of the light that has been emitted from the light source and reached the total reflection region located on the outer peripheral side of the first light exit surface is totally reflected at the total reflection region. For example, in the case where a reflecting plate is disposed on the light entrance surface side of the illuminating lens, the area of the surface to be irradiated located away from the optical axis of the lens is irradiated with the totally reflected light at the end. Furthermore, the most part of the light that has been emitted from the light source and reached the second light exit surface is refracted at the second light exit surface, and thus the area of the surface to be irradiated located away from the optical axis of the lens is irradiated with the refracted light. Accordingly, the present invention makes it possible to obtain a wider range of transmission directions for light from the light source. Therefore, the outer diameter of the lens of the present invention may be smaller than that of a conventional lens having a concave for only refracting light.

DETAILED DESCRIPTION OF THE INVENTION

First Embodiment

Figure 1:
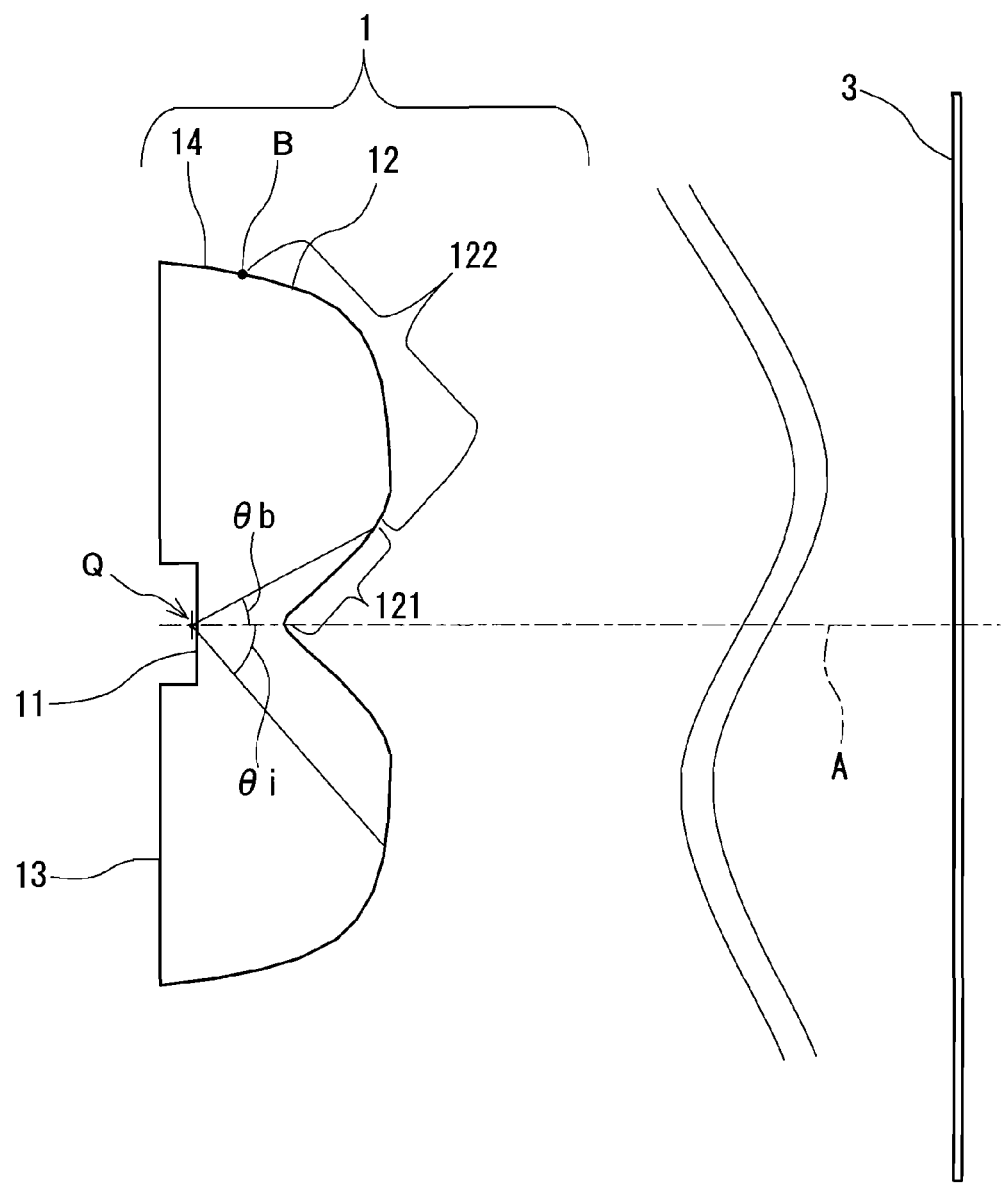
FIG. 1 is a schematic diagram of an illuminating lens according to a first embodiment of the present invention.

An illuminating lens according to the first embodiment of the present invention will be described with reference to the accompanying drawings. FIG. 1 is a schematic diagram of an illuminating lens 1 according to the first embodiment. The illuminating lens 1, which is disposed between a light source (not shown in FIG. 1) having directivity and a surface to be irradiated 3, spreads light emitted from the light source and emits the spread light to the surface to be irradiated 3. That is, the illuminating lens 1 widens the range of transmission directions for light from the light source. In the illuminance distribution on the surface to be irradiated 3, the illuminance is greatest on the optical axis A that is the design center line of the illuminating lens 1 and decreases almost monotonically toward the edge. The light source and the illuminating lens 1 are disposed so that their optical axes coincide with each other.

Specifically, the illuminating lens 1 has a light entrance surface 11 through which the light emitted from the light source enters the lens and a light exit surface 12 through which the light that has entered the lens exits the lens. The illuminating lens 1 has a bottom surface 13 surrounding the light entrance surface 11 and facing oppositely to the light exit surface 12. The illuminating lens 1 further has an outer peripheral surface 14 located outwardly of the light exit surface 12 to connect the periphery of the light exit surface 12 and the outer edge of the bottom surface 13.

The light entrance surface 11 need not be rotationally symmetric with respect to the optical axis A. In the present embodiment, the light entrance surface 11 is located closer to the light exit surface 12 than the annular bottom surface 13 surrounding the light entrance surface 11, and the light source is fitted in the recess formed by the level difference between the surfaces 11 and 13. The light entrance surface 11 and the bottom surface 13 may be located on the same level. In this case, the light entrance surface 11 is the area that is connected optically to the light source. The light entrance surface 11 need not necessarily be joined directly to the light source. For example, the light entrance surface 11 may be recessed in a hemispherical shape so that an air space is formed between the light entrance surface 11 and the light source.

In the present embodiment, the light exit surface 12 is rotationally symmetric with respect to the optical axis A. The light exit surface 12 is the area (area located inwardly of a point B shown in FIG. 1) for controlling at least a specified amount (for example, 90%) of light emitted from the light source. The diameter of the light exit surface 12 is the effective diameter of the illuminating lens 1 when viewed from the optical axis direction.

Figure 27:
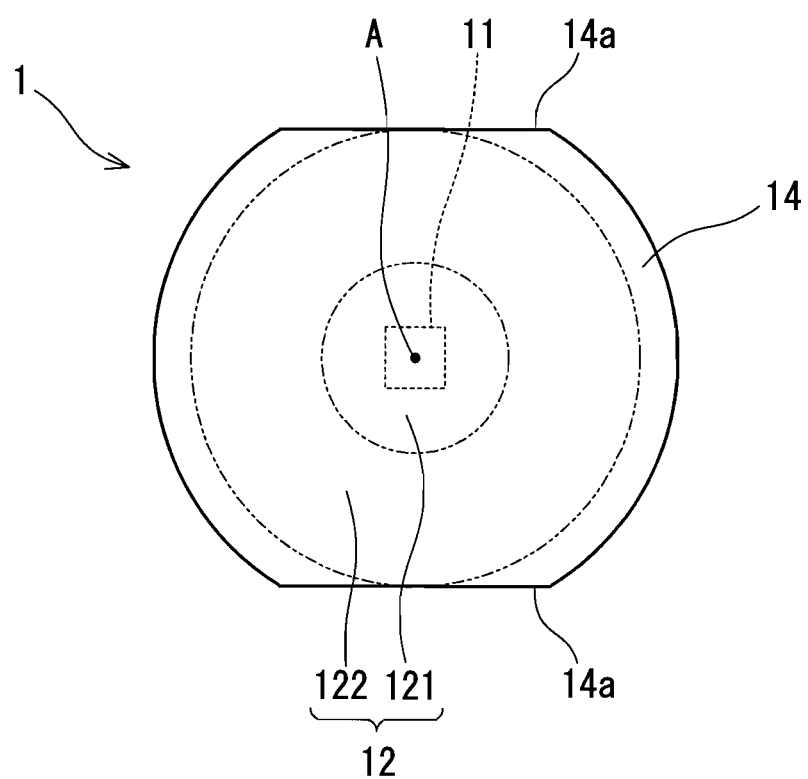
FIG. 27 is a plan view of an illuminating lens in which a pair of flat portions are formed on its outer peripheral surface.

The outer peripheral surface 14 forms a curved surface extending continuously from the light exit surface 12 in the present embodiment, but may be a tapered surface having a linear cross section. Alternatively, the illuminating lens 1 may be provided with a ring portion projecting from the entire periphery of the light exit surface 12 so that the end surface of the ring portion serves as the outer peripheral surface 14, although not illustrated here. The outer peripheral surface 14 need not be rotationally symmetric with respect to the optical axis A. For example, as shown in FIG. 27, the outer peripheral surface 14 may have a pair of flat portions 14a that are parallel to each other across the optical axis A such that the illuminating lens 1 has an oval shape when viewed from the optical axis direction.

The light emitted from the light source enters the illuminating lens 1 through the light entrance surface 11, exits the lens 1 through the light exit surface 12, and then reaches the surface to be irradiated 3. The light emitted from the light source is spread by the action of the light exit surface 12, and reaches a large area of the surface to be irradiated 3.

As the light source, for example, a light emitting diode can be used. Light emitting diodes usually are chips with a rectangular plate shape. Therefore, it is preferable that the light entrance surface 11 of the illuminating lens 1 have a shape conforming to the shape of a light emitting diode to fit in close contact with the light emitting diode. The light emitting diode is in contact with the light entrance surface 11 of the illuminating lens 1 via a bonding agent, and connected optically to the light entrance surface 11. The light emitting diode usually is covered with a sealing resin to avoid contact with air, but the light emitting diode need not be covered with a sealing resin because the illuminating lens 1 serves as a sealing resin. As a conventional sealing resin for a light emitting diode, an epoxy resin, silicone rubber, or the like is used.

The illuminating lens 1 is made of a transparent material having a specified refractive index. The refractive index of the transparent material is, for example, about 1.4 to 1.5. Examples of such a transparent material include resins such as epoxy resin, silicone resin, acrylic resin, and polycarbonate, and rubbers such as silicone rubber. Particularly, it is preferable to use epoxy resin, silicone rubber, or the like that has been used as a sealing resin for a light emitting diode.

The light exit surface 12 includes a first light exit surface 121 that is recessed toward a point on the optical axis A, and a second light exit surface 122 extending radially outwardly from the periphery of the first light exit surface 121 to form a convex. Light enters the illuminating lens 1 through the light entrance surface 11 at a wide range of angles. Light that has entered the lens at a small angle with respect to the optical axis A reaches the first light exit surface 121, and light that has entered the lens at a larger angle with respect to the optical axis A reaches the second light exit surface 122.

Next, the shapes of the first light exit surface 121 and the second light exit surface 122 will be described. For that purpose, a starting point Q is defined first, and then light emitted from the starting point Q is assumed. As stated herein, the starting point Q is the position of the light source on the optical axis A. In the case where a light emitting diode is used as a light source, the starting point Q is the point of intersection of the optical axis A and the light emitting surface that is the front surface of the light emitting diode. That is, the starting point Q is spaced from the light entrance surface 11 by the thickness of the above-mentioned bonding agent. When an angle between the optical axis A and a line connecting the starting point Q and the boundary between the first light exit surface 121 and the second light exit surface 122 is $\theta b$, light that has been emitted from the starting point Q at an angle reaches the first light exit surface 121 or the second light exit surface 122 based on the angle $\theta b$ as a threshold angle.

Figure 2:
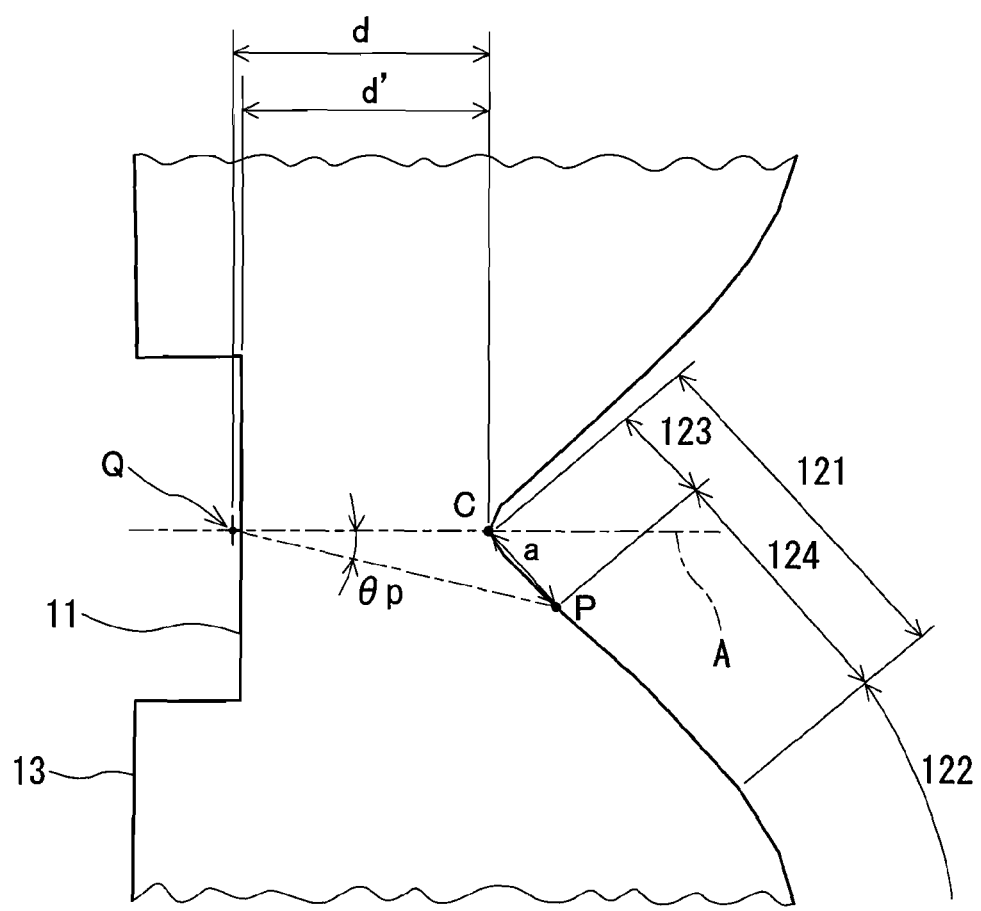
FIG. 2 is an enlarged view of the main portions of FIG. 1.

As shown in FIG. 2, the first light exit surface 121 includes a transmissive region 123 located in the center of the first light exit surface 121 and a total reflection region 124 located around the transmissive region 123. The transmissive region 123 transmits light that has been emitted from the starting point Q at a relatively small angle of less than a specified value of $\theta p$ with respect to the optical axis A and reached the first light exit surface 121, and the total reflection region 124 totally reflects light that has been emitted from the starting point Q at a relatively large angle of $\theta p$ or more with respect to the optical axis A and reached the first light exit surface 121. That is, $\theta p$ is an angle between the optical axis A and a line connecting a point P and the starting point Q, when the point P is a point on the boundary between the transparent region 123 and the total reflection region 124.

On the other hand, the second light exit surface 122 has a shape capable of transmitting approximately the entire amount of light that has been emitted from the starting point Q and reached the second light exit surface 122. The angle between the optical axis A and the light emitted from the starting point Q increases toward the outer edge of the second light exit surface 122. The angle of the light emitted from the starting point Q with respect to a normal line at the point on the second light exit surface 122 reached by the emitted light is the incident angle of the light with respect to the second light exit surface 122. An excessively large incident angle causes total reflection. The incident angle needs to be kept small in order to prevent total reflection. Accordingly, the second light exit surface 122 has a shape such that the angle between the normal line and the optical axis A increases with increasing distance from the optical axis A. That is, the shape of the second light exit surface 122 is a convex.

The entire second light exit surface 122 need not transmit the light emitted from the starting point Q (i.e., the second light exit surface 122 need not necessarily transmit the entire amount of the light). The second light exit surface 122 may have a shape capable of totally reflecting a part of the light emitted from the starting point Q and transmitting the remaining part of the light.

In the illuminating lens 1 configured as described above, the most part of the light that has been emitted from the light source and reached the transmissive region 123 located in the center of the first light exit surface 121 is refracted at the transmissive region 123, and thus the area surrounding the optical axis A of the lens on the surface to be irradiated 3 is irradiated with the refracted light. On the other hand, the most part of the light that has been emitted from the light source and reached the total reflection region 124 located on the peripheral side of the first light exit surface 121 is totally reflected at the total reflection region 124. For example, in the case where a reflecting plate is disposed on the light entrance surface 11 side of the illuminating lens 1, the area away from the optical axis A of the lens on the surface to be irradiated 3 is irradiated with the totally reflected light at the end. Furthermore, the most part of the light that has been emitted from the light source and reached the second light exit surface 122 is refracted at the second light exit surface 122, and thus the area away from the optical axis A of the lens on the surface to be irradiated 3 is irradiated with the refracted light. Accordingly, the illuminating lens 1 of the present embodiment allows the range of transmission directions for light from the light source to be widened further. Therefore, the outer diameter of the lens of the present embodiment may be smaller than that of a conventional lens having a concave for only refracting light.

The basic configuration of the illuminating lens 1 of the present embodiment has been described so far. A preferable configuration of the illuminating lens 1 of the present embodiment will be described below.

It is preferable that the above-mentioned angle θb (see FIG. 1) between the optical axis A and the line connecting the starting point Q and the boundary between the first light exit surface 121 and the second light exit surface 122 satisfies the following inequality (1):

$$20 \text{ degrees} < \theta b < 40 \text{ degrees} \quad (1)$$

The inequality (1) defines the range of the first light exit surface 121. The inequality (1) defines the range of the first light exit surface 121 with an angle based on the starting point Q (polar coordinate), and indicates the range of angles at which light to be directed to the surface to be irradiated 3 can be allocated appropriately to an area surrounding the optical axis A of the lens on the surface to be irradiated 3 (hereinafter referred to as a "near-axis area") and an area away from the optical axis A of the lens on the surface to be irradiated 3 (hereinafter referred to as an "outer peripheral area"). When θb is 40 degrees or more, the range of the first light exit surface 121 increases and the light that has been emitted from the light source toward the vicinity of the optical axis is directed excessively outwardly. As a result, the near-axis area of the surface to be irradiated 3 has a low illuminance, which causes an uneven illuminance on the surface 3. On the other hand, when the θb is 20 degrees or less, the range of the first light exit surface 121 decreases, and thus a large amount of light is directed to the near-axis area of the surface to be irradiated 3 while sufficient light cannot be directed to the outer peripheral area. As a result, not only the surface 3 has an uneven illuminance but also the range of light transmission directions is narrowed.

When the point of intersection of the first light exit surface 122 and the optical axis A is denoted as C, the distance between the point C and the starting point Q is denoted as d, and the length of the straight line connecting the point C and the above-mentioned point P is denoted as a, as shown in FIG. 2, it is preferable that the following inequality (2) is satisfied:

$$1.10 < a/(d \times \tan \theta p) < 1.30 \quad (2)$$

The inequality (2) defines the range of the transmissive region 123 of the first light exit surface 121, and indicates the amount of light directed to the near-axis area of the surface to be irradiated 3. When "a/(d tan θp)" in the inequality (2) is 1.30 or more, an excessive amount of light passes through the transmissive region 123. As a result, the near-axis area of the surface to be irradiated 3 has a high illuminance, which causes an uneven illuminance on the surface 3. On the other hand, when "a/(d tan θp)" in the inequality (2) is 1.10 or less, the amount of light that passes through the transmissive region 123 decreases excessively. As a result, the near-axis area of the surface to be irradiated 3 has a low illuminance, which causes an uneven illuminance on the surface 3.

Furthermore, it is preferable that the following inequalities (3) and (4) are satisfied. When the thickness of the illuminating lens 1 on the optical axis A (i.e., the distance from the point C to the light entrance surface 11) is denoted as d', and the outermost radius of the illuminating lens 1 is denoted as R, the inequality (3) is expressed as follows:

$$d'/2R < 0.25 \quad (3)$$

In addition, in the case where the surface to be irradiated 3 is illuminated via the illuminating lens 1, when the distribution width of illuminances of 0.2 or more in an illuminance distribution curve on the surface to be irradiated 3, which is obtained by normalizing illuminances with respect to an illuminance at the center of the optical axis being 1, is denoted as $\delta_L$, and in the case where the surface to be irradiated 3 is illuminated only by the light source, when the distribution width of illuminances of 0.2 or more in an illuminance distribution curve on the surface to be irradiated 3, which is obtained by normalizing illuminances with respect to an illuminance at the center of the optical axis being 1, is denoted as $\delta_S$, the inequality (4) is expressed as follows:

$$2.0 < \delta_L/\delta_S < 4.0 \quad (4)$$

When "d'/2R" in the inequality (3) is 0.25 or more and the inequality (3) is not satisfied, the ratio between the first light exit surface 121 and the second light exit surface 122 is out of balance in the light exit surface 12, which causes an uneven illuminance.

In the inequality (4), "$\delta_L/\delta_S$" indicates a ratio of illuminance distribution between the case with the illuminating lens and the case without the illuminating lens. When the value of $\delta_L/\delta_S$ is 4.0 or more, the range of light transmission directions is widened, but the illuminated area is excessively large, which causes an insufficient illuminance. On the other hand, when the value of $\delta_L/\delta_S$" is 2.0 or less, the lens itself is large in size. As a result, the compact property and the cost effectiveness of the lens decrease, and the range of light transmission directions is narrowed.

The illuminating lens of the present invention also is applicable to light sources (such as lasers and organic ELs) as well as light emitting diodes.

Figure 28A:
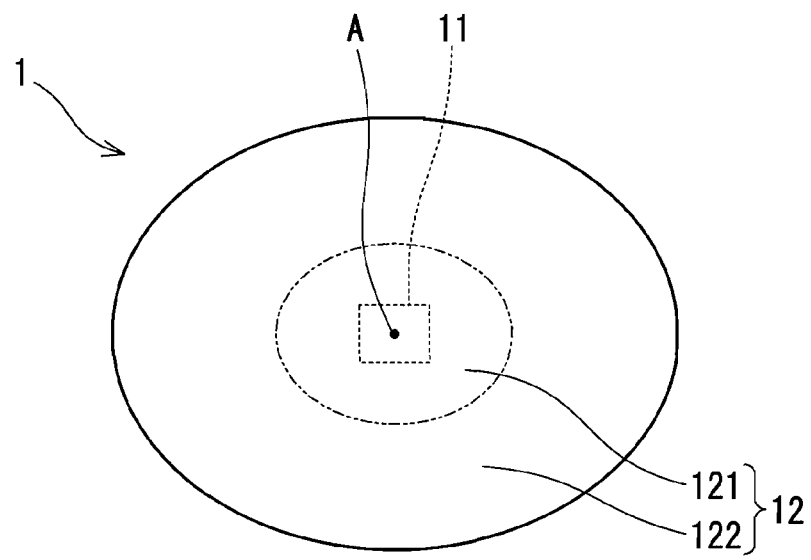
FIG. 28A and FIG. 28B are each a plan view of an illuminating lens of another embodiment.
Figure 28B:
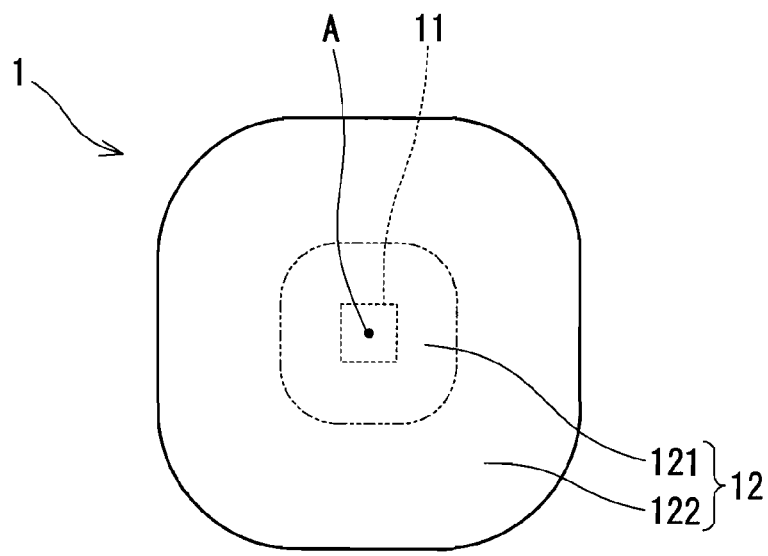

In the present embodiment, the light exit surface 12 is axisymmetric with respect to the optical axis A. The light exit surface 12, however, need not be axisymmetric with respect to the optical axis A. For example, as shown in FIG. 28A, the light exit surface 12 may have an elliptical shape when viewed from the optical axis direction. This illuminating lens 1 is suitable particularly for an elongated light source. Alternatively, as shown in FIG. 28B, the light exit surface 12 may have a rounded rectangular shape when viewed from the optical axis direction.

(Modification)

Figure 7:
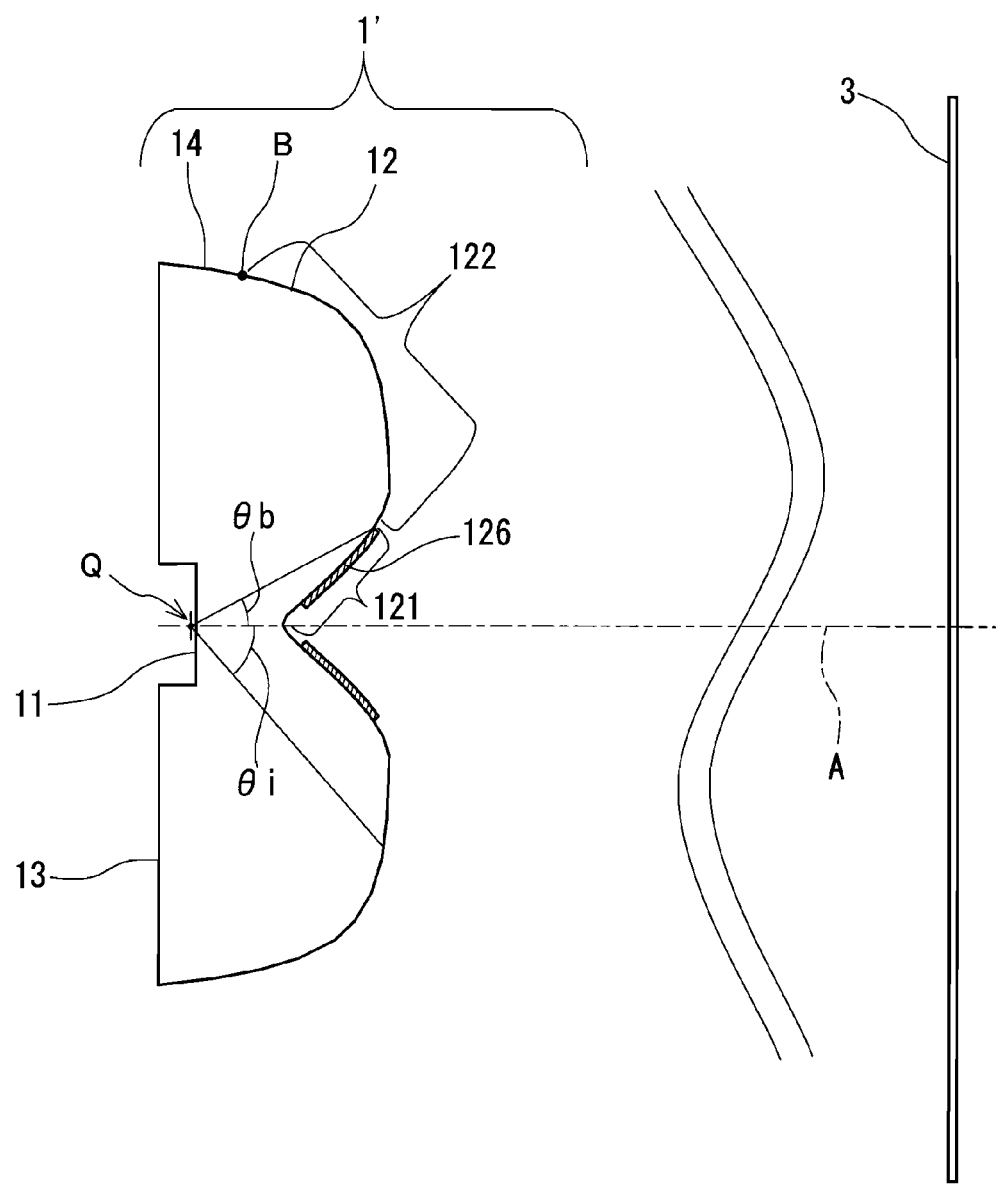
FIG. 7 is a schematic diagram of a modified illuminating lens.
Figure 8:
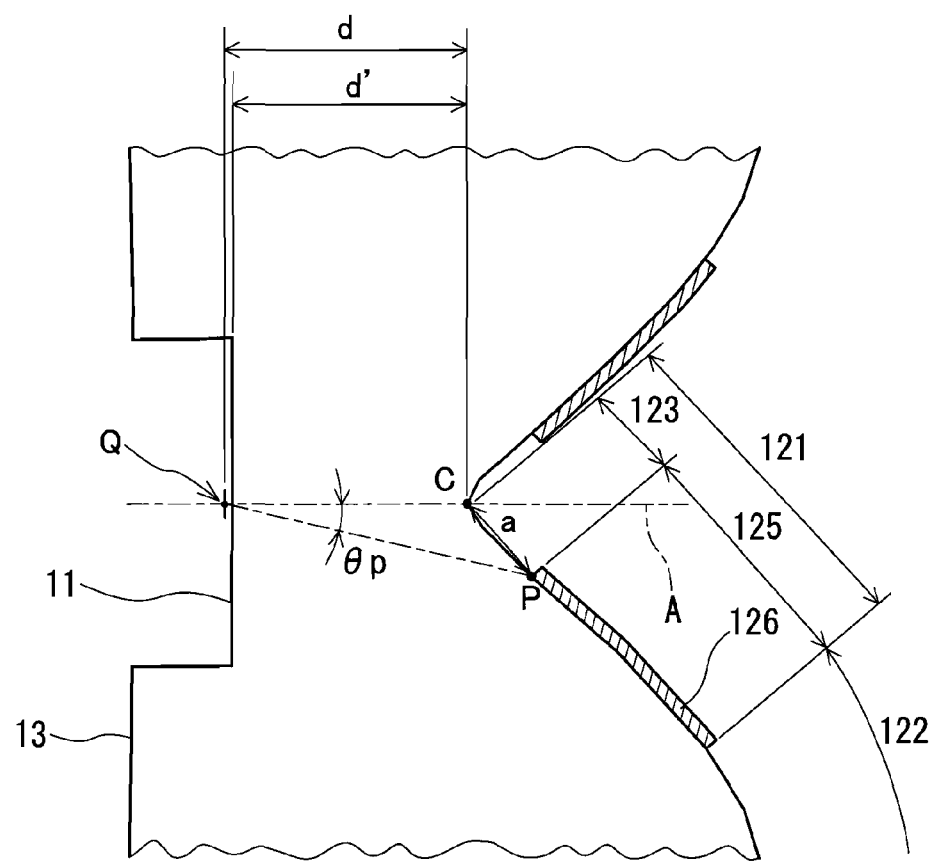
FIG. 8 is an enlarged view of the main portions of FIG. 7.

Next, a Modified Illuminating Lens 1' Will be Described with Reference to FIG. 7 and FIG. 8. The same components as those in the above-described illuminating lens 1 are denoted by the same reference numerals.

In this illuminating lens 1', the first light exit surface 121 has a specular reflection region 125 covered with a reflective layer 126, instead of the total reflection region 124 (see FIG. 2). Therefore, the light that has been emitted from the starting point Q at an angle of θp or more with respect to the optical axis A and reached the first light exit surface 121 is specularly reflected at the reflective layer 126. The optical path of the specularly reflected light is the same as that of the totally reflected light. The reflective layer 126 may be formed of a reflective film obtained by applying a reflective material on the specular reflection region 125 and curing the material. The reflective layer 126 also may be formed of a reflective sheet attached to the specular reflection region 125.

In the case where specular reflection is utilized as in the present modification, the angle of inclination of the first light exit surface 121 can be reduced compared with the case where total reflection is utilized. Therefore, the flexibility in designing the lens shape can be increased. The specular reflection region 125 may have the same shape as the total reflection region 124. That is, when the specular reflection region 125 is not covered with the reflective layer 126, it may have a shape such that the light that has been emitted from the starting point Q at a specified angle of θp or more with respect to the optical axis A and reached the first light exit surface 121 can be totally reflected.

Second Embodiment

Figure 3:
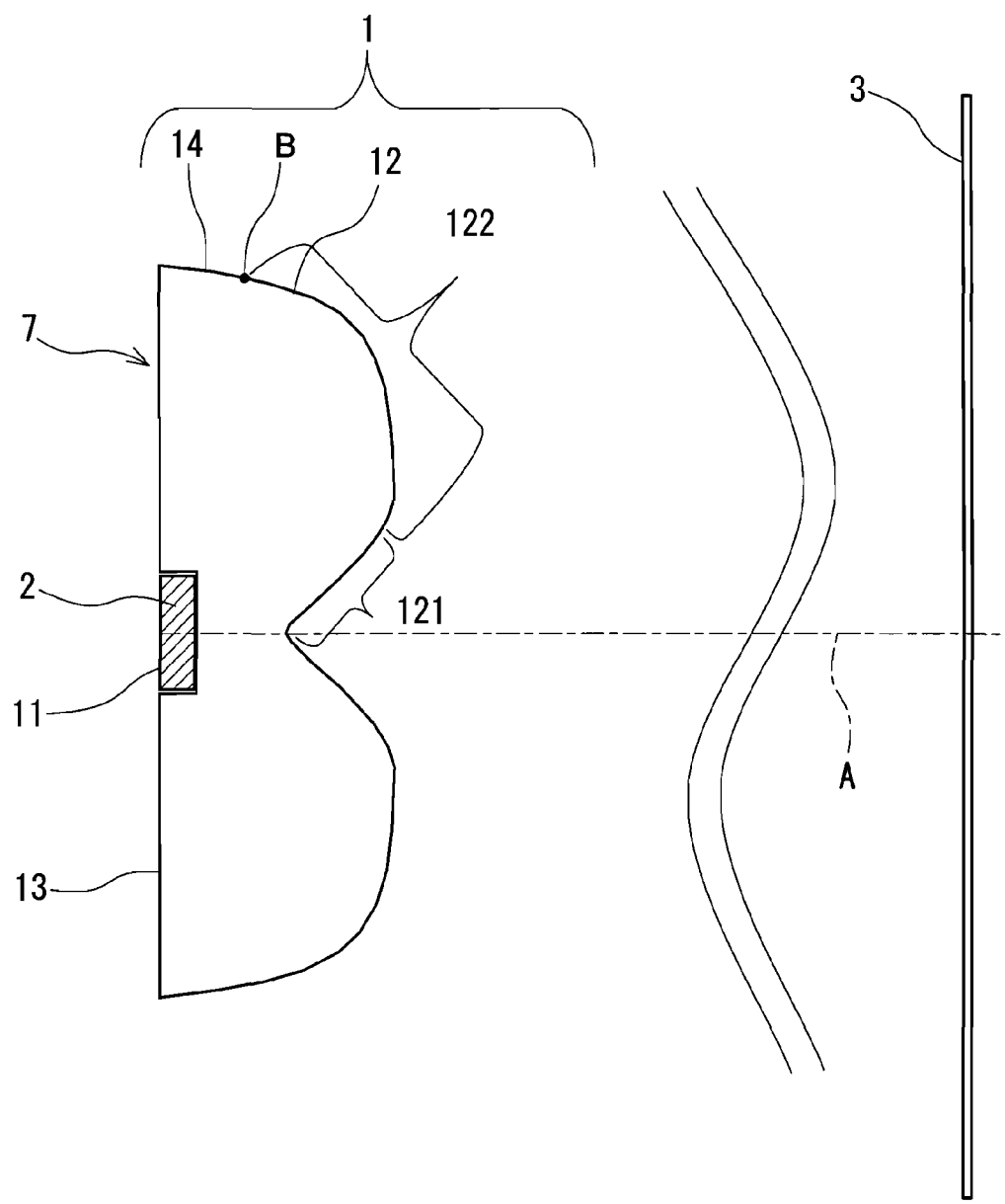
FIG. 3 is a schematic diagram of a lighting device according to a second embodiment of the present invention.

FIG. 3 is a schematic diagram of a lighting device 7 according to a second embodiment of the present invention. This lighting device 7 includes a light emitting diode 2 for emitting light, and an illuminating lens 1 of the first embodiment for spreading light emitted from the light emitting diode 2 so that the surface to be irradiated 3 is irradiated with the spread light.

The light emitting diode 2 is in contact with the light entrance surface 11 of the illuminating lens 1 via a bonding agent, and connected optically to the light entrance surface 11. The light that has exited the illuminating lens 1 through the light exit surface 12 reaches the surface to be irradiated 3, and thus the surface to be irradiated 3 is illuminated with that light.

Light generation in the light emitting diode 2 has no directivity in itself, and a light emitting region has a refractive index of at least 2.0. When light from the light emitting region enters a low refractive region, the refraction of the light at the interface causes the light to have the maximum intensity in the normal direction of the interface and to have a lower intensity as the angle of the light with respect to the normal line increases. As described above, since the light emitting diode 2 has high directivity, it is necessary to widen the range of transmission directions for light therefrom using the illuminating lens 1 to illuminate a larger area.

Figure 4:
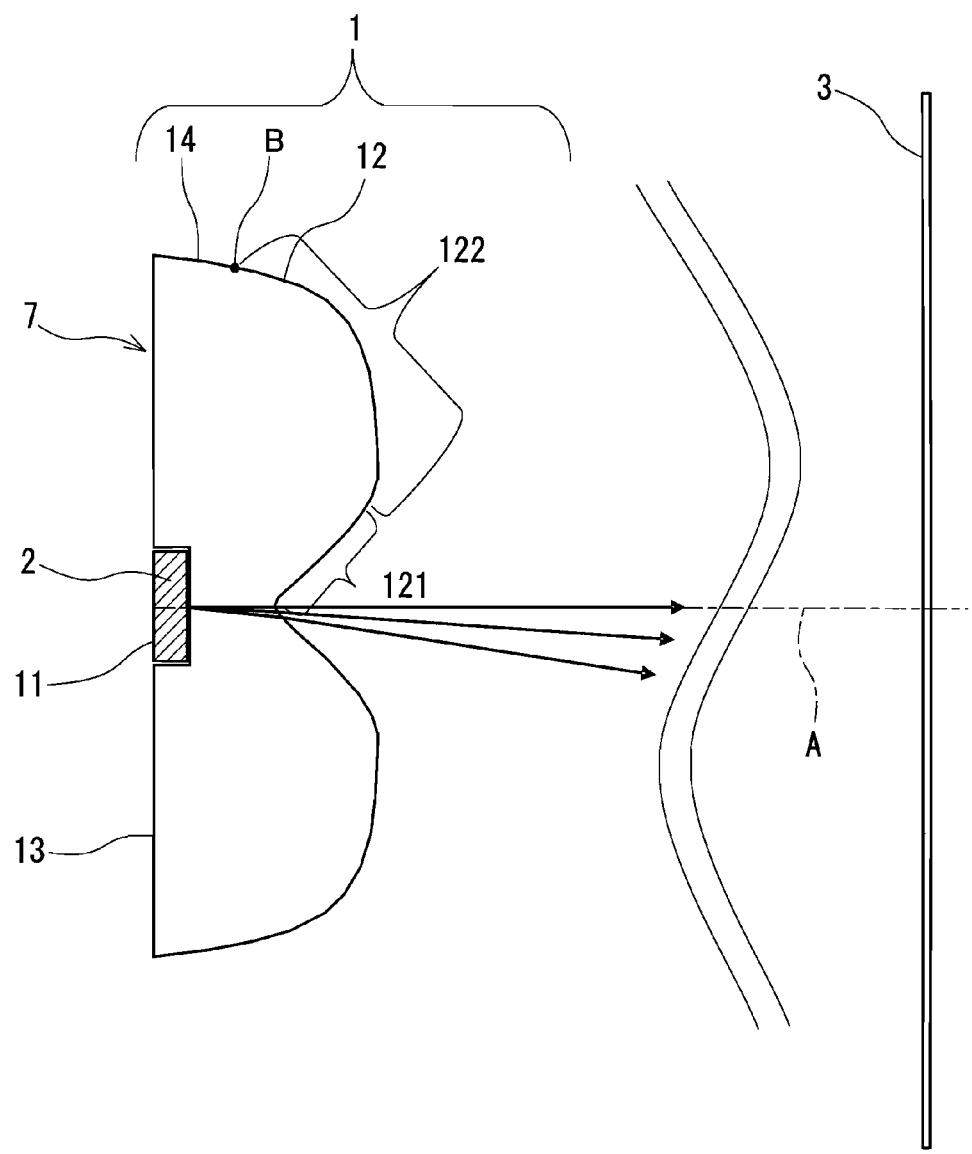
FIG. 4 is a diagram showing optical paths of light rays that reach a transmissive region of a first light exit surface of the lighting device according to the second embodiment of the present invention.

FIG. 4 is a diagram showing the paths of light rays in the lighting device 7. In FIG. 4, the paths of light rays that are emitted from the light source at small angles and reach the transmissive region 123 (see FIG. 2) of the first light exit surface 121 are described. The light that has been emitted from the light emitting diode 2 passes through the light entrance surface 11 and reaches the transmissive region 123 of the first light exit surface 121. The light that has reached the transmissive region 123 of the first light exit surface 121 passes through the transmissive region 123 while being refracted, and then reaches the surface to be irradiated 3.

Figure 5:
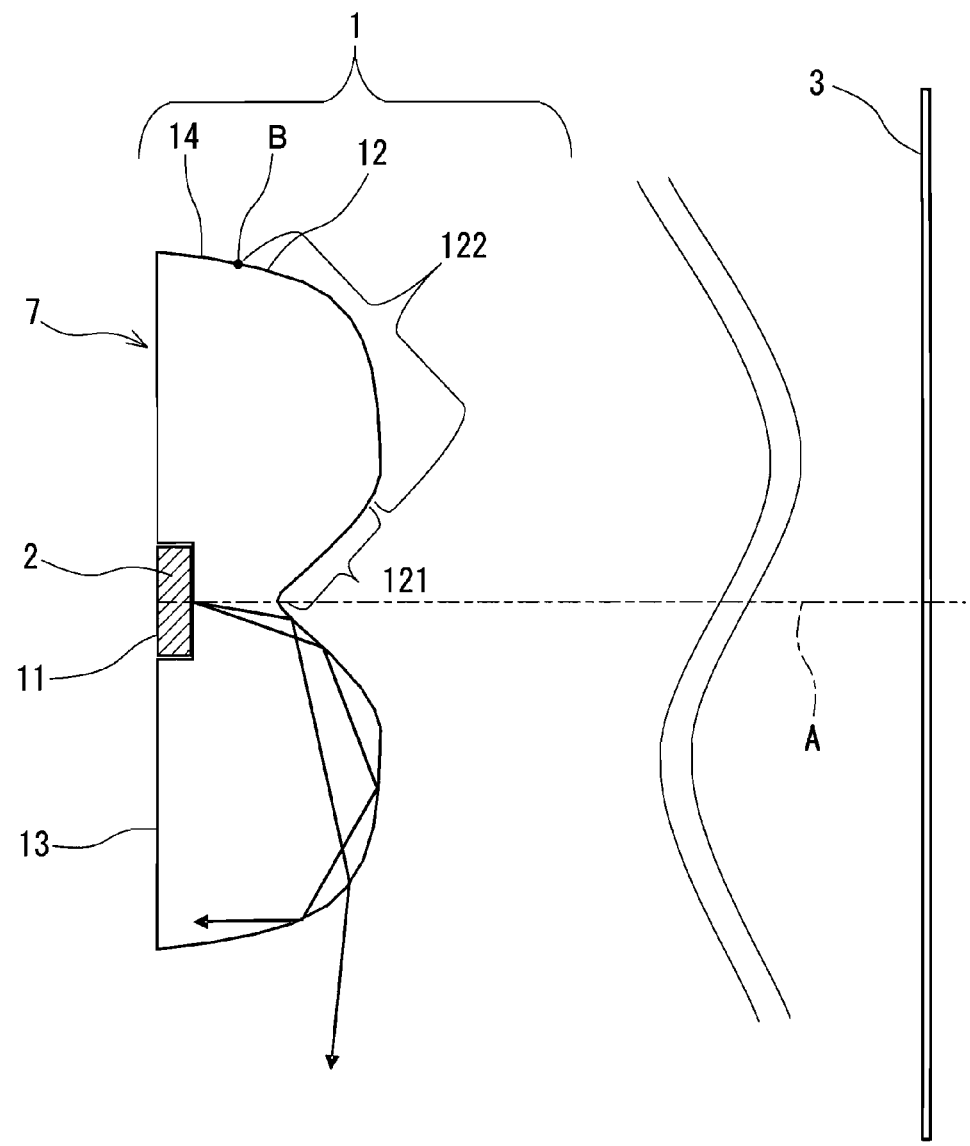
FIG. 5 is a diagram showing optical paths of light rays that reach a total reflection region of a first light exit surface of the lighting device according to the second embodiment of the present invention.

FIG. 5 is a diagram showing the paths of light rays in the lighting device 7. In FIG. 5, the paths of light rays that are emitted from the light source at small angles and reach the total reflection region 124 (see FIG. 2) of the first light exit surface 121 are described. The light that has been emitted from the light emitting diode 2 passes through the light entrance surface 11 and reaches the total reflection region 124 of the first light exit surface 121. The light that has reached the total reflection region 124 of the first light exit surface 121 is totally reflected at the total reflection region 124. The light that has traveled near the optical axis A is totally reflected to reach the second light exit surface 122, and then passes through the second light exit surface 122 while being refracted. In the case where a reflecting plate is provided on the side of the light entrance surface 11 of the illuminating lens 1, approximately the entire amount of light that has passed through the second light exit surface 122 reaches the surface to be irradiated 3. On the other hand, the light that has traveled away from the optical axis A is totally reflected to reach the second light exit surface 122. Then, the totally reflected light is reflected one or more times within the illuminating lens 1, passes through the light exit surface 12 while being refracted, and reaches the surface to be irradiated 3.

Figure 6:
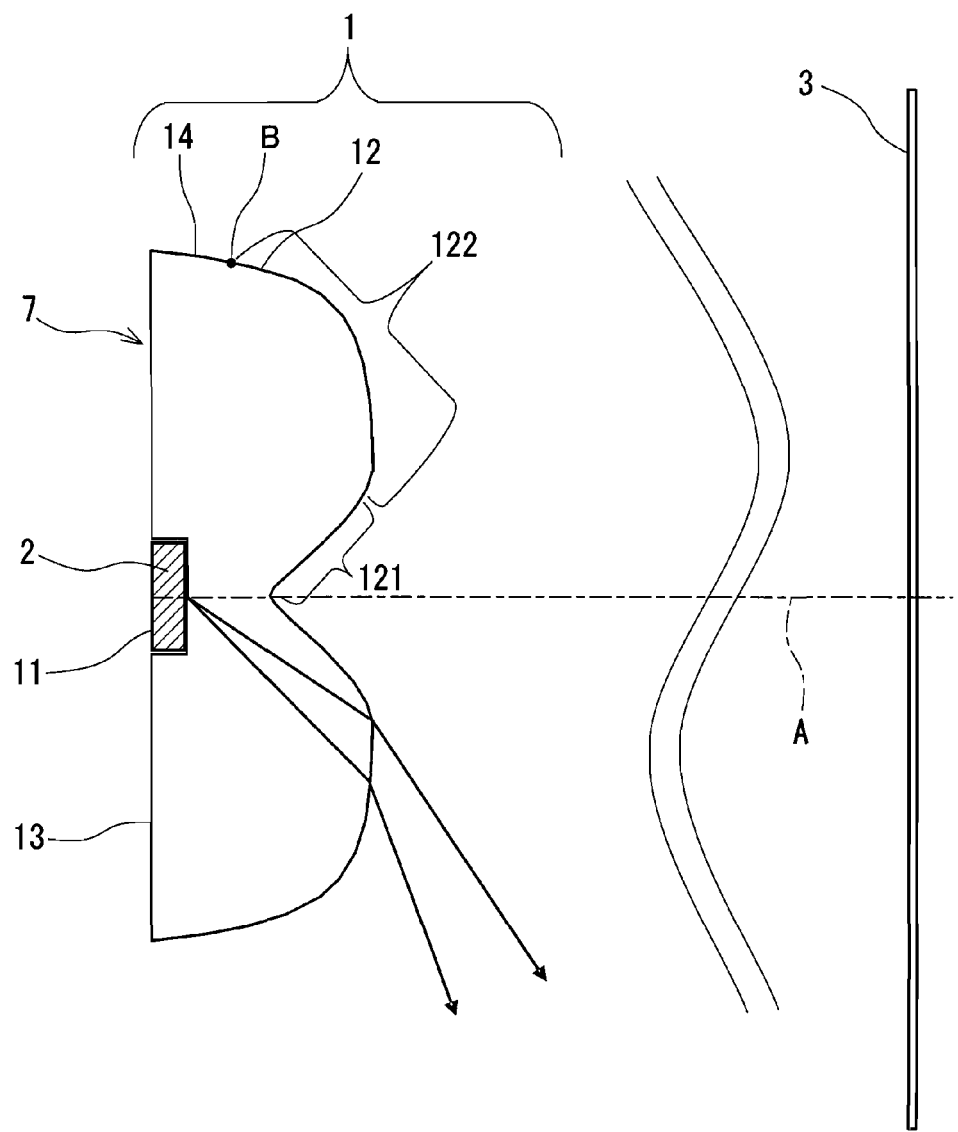
FIG. 6 is a diagram showing optical paths of light rays that exist the lighting device through a second light exit surface thereof according to the second embodiment of the present invention.

FIG. 6 is a diagram showing the paths of light rays in the lighting device 7. In FIG. 6, the paths of light rays that are emitted from the light source at larger angles and reach the second light exit surface 122 are described. The light that has been emitted from the light emitting diode 2 passes through the light entrance surface 11 and reaches the second light exit surface 122. In the case where the second light exit surface 122 does not have a shape capable of totally reflecting a part of the light, approximately the entire amount of the light that has reached the second light exit surface 122 passes through the second light exit surface 122 while being refracted, and then reaches the surface to be irradiated 3.

Hereinafter, Examples 1 to 3 are given as specific numerical examples of the present invention.

Figure 9:
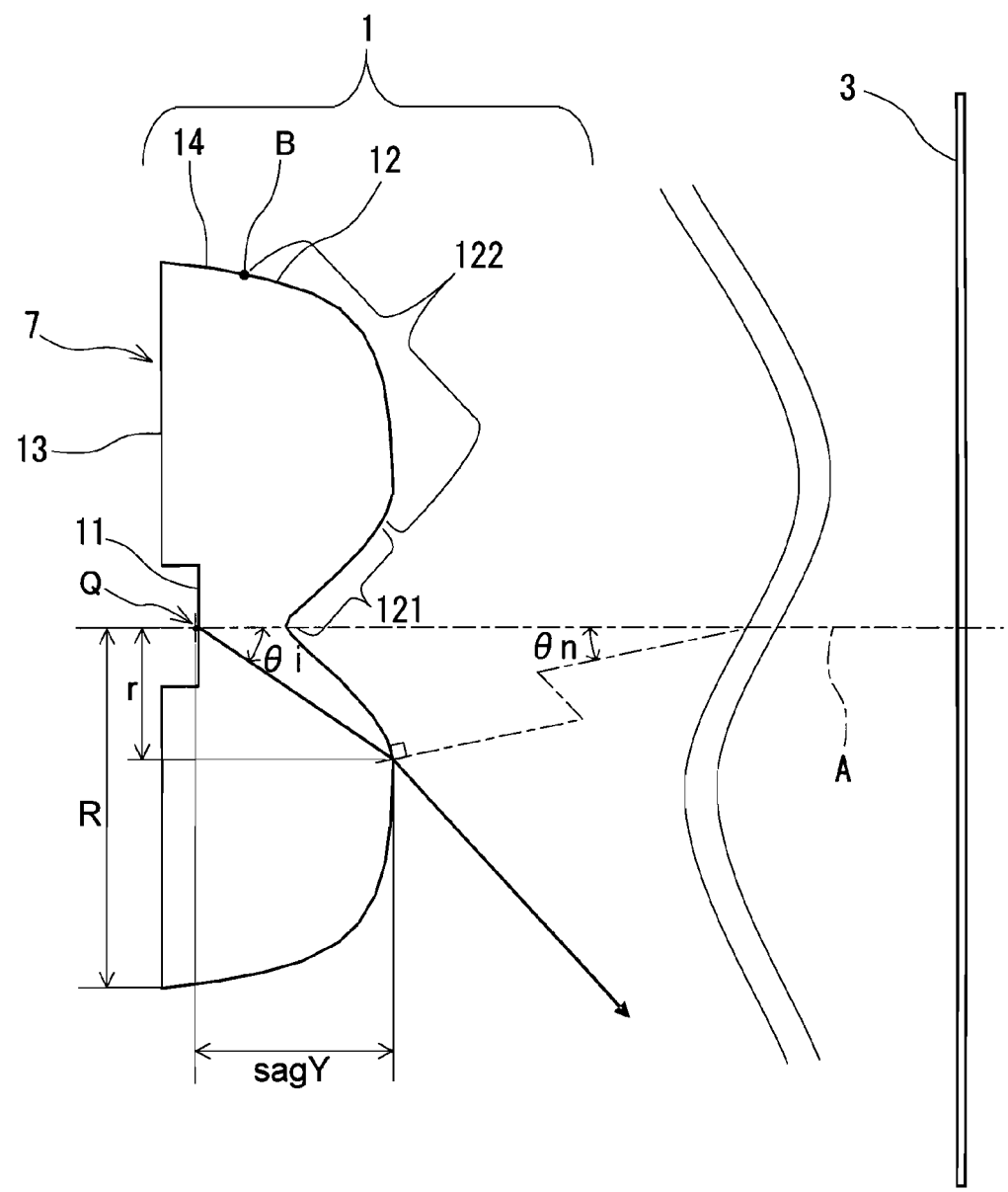
FIG. 9 is a diagram for explaining Examples 1 to 3 of the lighting device according to the second embodiment of the present invention.

FIG. 9 is a schematic diagram of a lighting device in Examples 1 to 3 according to the second embodiment of the present invention. Examples 1 to 3 are examples of a lighting device designed to widen the range of transmission directions for light from a 0.45 mm cubic-shaped light emitting diode as a light source. In FIG. 9, θi is an angle between the optical axis A and a straight line connecting the position of the light source (starting point Q) on the optical axis A and an arbitrary point on the light exit surface 12. In FIG. 9, θn is an angle between the optical axis A and a normal line at the arbitrary point on the light exit surface 12, that is, a normal line at a position on the light exit surface 12 reached by the light that has been emitted from the light source position (starting point Q) on the optical axis A at an angle of θi. Furthermore, in FIG. 9, sagY is a distance along the optical axis A between the light source position (starting point Q) on the optical axis A and the arbitrary point on the light exit surface 12.

Example 1

Table 1 below shows specific numerical values in Example 1.

TABLE 1

| θi | sagY |
|---|---|
| 0.00 | 0.485 |
| 0.76 | 0.485 |
| 1.52 | 0.487 |
| 2.26 | 0.490 |
| 2.99 | 0.494 |
| 3.70 | 0.499 |
| 4.38 | 0.505 |
| 5.05 | 0.511 |
| 5.70 | 0.517 |
| 6.33 | 0.523 |
| 6.94 | 0.530 |
| 7.53 | 0.537 |
| 8.10 | 0.544 |
| 8.65 | 0.551 |
| 9.19 | 0.558 |
| 9.71 | 0.565 |
| 10.22 | 0.572 |
| 10.71 | 0.580 |
| 11.19 | 0.587 |
| 11.65 | 0.594 |
| 12.10 | 0.602 |
| 12.54 | 0.609 |
| 12.97 | 0.616 |
| 13.38 | 0.624 |
| 13.79 | 0.631 |
| 14.18 | 0.638 |
| 14.56 | 0.645 |
| 14.94 | 0.653 |
| 15.30 | 0.660 |
| 15.66 | 0.667 |
| 16.01 | 0.675 |
| 16.35 | 0.682 |
| 16.68 | 0.689 |
| 17.00 | 0.696 |
| 17.32 | 0.703 |
| 17.63 | 0.710 |
| 17.93 | 0.717 |
| 18.23 | 0.724 |
| 18.52 | 0.731 |
| 18.81 | 0.738 |
| 19.09 | 0.745 |
| 19.37 | 0.752 |
| 19.64 | 0.759 |
| 19.90 | 0.766 |
| 20.17 | 0.773 |
| 20.42 | 0.779 |
| 20.68 | 0.786 |
| 20.92 | 0.793 |
| 21.17 | 0.799 |
| 21.41 | 0.806 |
| 21.65 | 0.813 |
| 21.88 | 0.819 |
| 22.11 | 0.825 |
| 22.34 | 0.832 |
| 22.57 | 0.838 |
| 22.79 | 0.844 |
| 23.01 | 0.850 |
| 23.23 | 0.857 |
| 23.44 | 0.863 |
| 23.66 | 0.869 |
| 23.87 | 0.875 |
| 24.08 | 0.881 |
| 24.28 | 0.886 |
| 24.49 | 0.892 |
| 24.69 | 0.898 |
| 24.89 | 0.904 |
| 25.09 | 0.909 |
| 25.29 | 0.915 |
| 25.49 | 0.920 |
| 25.68 | 0.925 |
| 25.88 | 0.931 |
| 26.07 | 0.936 |

TABLE 1-continued

| θi | sagY |
|---|---|
| 26.26 | 0.941 |
| 26.45 | 0.946 |
| 26.64 | 0.951 |
| 26.83 | 0.956 |
| 27.02 | 0.961 |
| 27.21 | 0.966 |
| 27.40 | 0.971 |
| 27.59 | 0.975 |
| 27.77 | 0.980 |
| 27.96 | 0.984 |
| 28.15 | 0.989 |
| 28.33 | 0.993 |
| 28.52 | 0.997 |
| 28.70 | 1.001 |
| 28.89 | 1.005 |
| 29.07 | 1.009 |
| 29.26 | 1.013 |
| 29.45 | 1.017 |
| 29.63 | 1.021 |
| 29.82 | 1.024 |
| 30.00 | 1.028 |
| 30.19 | 1.031 |
| 30.38 | 1.034 |
| 30.57 | 1.038 |
| 30.75 | 1.041 |
| 30.94 | 1.044 |
| 31.13 | 1.047 |
| 31.32 | 1.049 |
| 31.51 | 1.052 |
| 31.70 | 1.055 |
| 31.89 | 1.057 |
| 32.09 | 1.060 |
| 32.28 | 1.062 |
| 32.48 | 1.064 |
| 32.67 | 1.066 |
| 32.87 | 1.068 |
| 33.07 | 1.070 |
| 33.26 | 1.072 |
| 33.47 | 1.073 |
| 33.70 | 1.074 |
| 33.94 | 1.074 |
| 34.18 | 1.073 |
| 34.42 | 1.073 |
| 34.66 | 1.073 |
| 34.89 | 1.073 |
| 35.13 | 1.073 |
| 35.36 | 1.072 |
| 35.60 | 1.072 |
| 35.83 | 1.072 |
| 36.06 | 1.072 |
| 36.29 | 1.072 |
| 36.52 | 1.072 |
| 36.74 | 1.071 |
| 36.97 | 1.071 |
| 37.19 | 1.071 |
| 37.42 | 1.071 |
| 37.64 | 1.070 |
| 37.86 | 1.070 |
| 38.08 | 1.070 |
| 38.30 | 1.070 |
| 38.52 | 1.069 |
| 38.74 | 1.069 |
| 38.96 | 1.069 |
| 39.17 | 1.069 |
| 39.39 | 1.068 |
| 39.60 | 1.068 |
| 39.81 | 1.068 |
| 40.02 | 1.068 |
| 40.23 | 1.067 |
| 40.44 | 1.067 |
| 40.65 | 1.067 |
| 40.86 | 1.066 |
| 41.06 | 1.066 |
| 41.27 | 1.066 |
| 41.47 | 1.065 |
| 41.68 | 1.065 |
| 41.88 | 1.065 |
| 42.08 | 1.064 |

TABLE 1-continued

| θi | sagY |
|---|---|
| 42.28 | 1.064 |
| 42.48 | 1.063 |
| 42.68 | 1.063 |
| 42.88 | 1.063 |
| 43.08 | 1.062 |
| 43.28 | 1.062 |
| 43.47 | 1.061 |
| 43.67 | 1.061 |
| 43.86 | 1.060 |
| 44.06 | 1.060 |
| 44.25 | 1.059 |
| 44.44 | 1.059 |
| 44.63 | 1.058 |
| 44.83 | 1.058 |
| 45.02 | 1.057 |
| 45.21 | 1.057 |
| 45.39 | 1.056 |
| 45.58 | 1.055 |
| 45.77 | 1.055 |
| 45.96 | 1.054 |
| 46.15 | 1.053 |
| 46.33 | 1.053 |
| 46.52 | 1.052 |
| 46.70 | 1.051 |
| 46.89 | 1.051 |
| 47.07 | 1.050 |
| 47.26 | 1.049 |
| 47.44 | 1.048 |
| 47.62 | 1.047 |
| 47.81 | 1.047 |
| 47.99 | 1.046 |
| 48.17 | 1.045 |
| 48.35 | 1.044 |
| 48.54 | 1.043 |
| 48.72 | 1.042 |
| 48.90 | 1.041 |
| 49.08 | 1.040 |
| 49.26 | 1.039 |
| 49.44 | 1.038 |
| 49.62 | 1.037 |
| 49.80 | 1.036 |
| 49.98 | 1.034 |
| 50.16 | 1.033 |
| 50.34 | 1.032 |
| 50.52 | 1.031 |
| 50.70 | 1.029 |
| 50.88 | 1.028 |
| 51.06 | 1.027 |
| 51.25 | 1.025 |
| 51.43 | 1.024 |
| 51.61 | 1.022 |
| 51.79 | 1.021 |
| 51.97 | 1.019 |
| 52.15 | 1.017 |
| 52.33 | 1.016 |
| 52.51 | 1.014 |
| 52.69 | 1.012 |
| 52.88 | 1.011 |
| 53.06 | 1.009 |
| 53.24 | 1.007 |
| 53.43 | 1.005 |
| 53.61 | 1.003 |
| 53.79 | 1.001 |
| 53.98 | 0.999 |
| 54.16 | 0.997 |
| 54.35 | 0.995 |
| 54.54 | 0.992 |
| 54.72 | 0.990 |
| 54.91 | 0.988 |
| 55.10 | 0.985 |
| 55.29 | 0.983 |
| 55.48 | 0.980 |
| 55.67 | 0.978 |
| 55.87 | 0.975 |
| 56.06 | 0.972 |
| 56.25 | 0.970 |
| 56.45 | 0.967 |
| 56.65 | 0.964 |

TABLE 1-continued

| θi | sagY |
|---|---|
| 56.84 | 0.961 |
| 57.04 | 0.958 |
| 57.24 | 0.955 |
| 57.44 | 0.951 |
| 57.65 | 0.948 |
| 57.85 | 0.945 |
| 58.06 | 0.941 |
| 58.27 | 0.937 |
| 58.47 | 0.934 |
| 58.69 | 0.930 |
| 58.90 | 0.926 |
| 59.12 | 0.922 |
| 59.33 | 0.918 |
| 59.55 | 0.914 |
| 59.78 | 0.909 |
| 60.00 | 0.905 |
| 60.23 | 0.900 |
| 60.46 | 0.896 |
| 60.69 | 0.891 |
| 60.93 | 0.886 |
| 61.17 | 0.881 |
| 61.41 | 0.875 |
| 61.66 | 0.870 |
| 61.91 | 0.864 |
| 62.16 | 0.858 |
| 62.42 | 0.852 |
| 62.69 | 0.846 |
| 62.95 | 0.840 |
| 63.23 | 0.833 |
| 63.51 | 0.826 |
| 63.79 | 0.819 |
| 64.08 | 0.812 |
| 64.38 | 0.804 |
| 64.69 | 0.796 |
| 65.00 | 0.788 |
| 65.32 | 0.780 |
| 65.65 | 0.771 |
| 65.99 | 0.762 |
| 66.33 | 0.752 |
| 66.69 | 0.742 |
| 67.06 | 0.732 |
| 67.43 | 0.721 |
| 67.83 | 0.710 |
| 68.23 | 0.698 |
| 68.65 | 0.686 |
| 69.08 | 0.673 |
| 69.53 | 0.660 |
| 69.99 | 0.646 |
| 70.47 | 0.631 |
| 70.97 | 0.616 |
| 71.50 | 0.600 |
| 72.04 | 0.583 |
| 72.60 | 0.566 |
| 73.19 | 0.547 |
| 73.81 | 0.528 |
| 74.45 | 0.508 |
| 75.13 | 0.487 |
| 75.83 | 0.464 |
| 76.57 | 0.441 |
| 77.34 | 0.416 |
| 78.15 | 0.390 |
| 79.00 | 0.362 |
| 79.89 | 0.333 |
| 80.83 | 0.303 |
| 81.82 | 0.271 |
| 82.85 | 0.237 |
| 83.94 | 0.201 |
| 85.09 | 0.164 |
| 86.29 | 0.124 |
| 87.56 | 0.082 |
| 88.88 | 0.037 |

Figure 10:
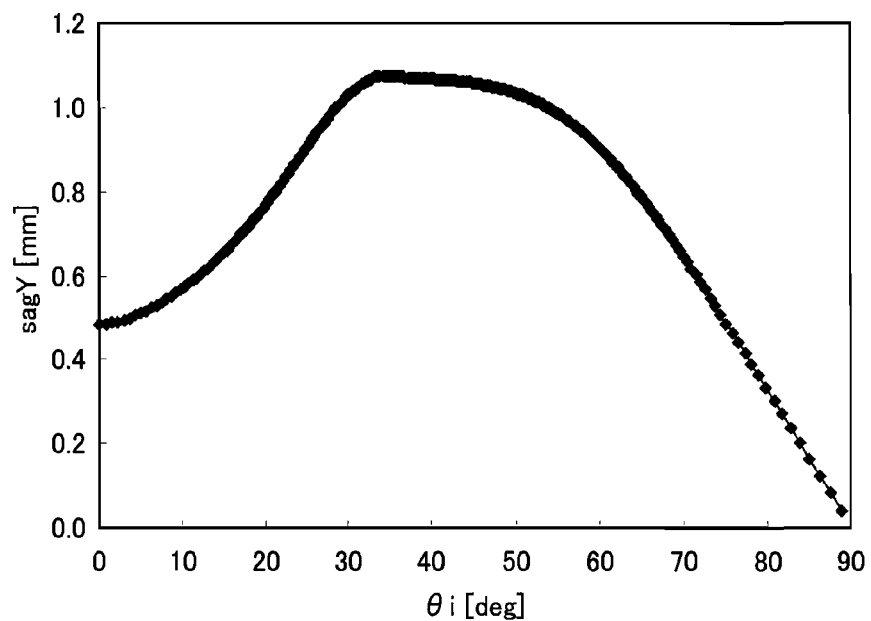
FIG. 10 is a graph showing a relationship between $\theta i$ and sagY, which represent the shape of the light exit surface in Example 1 of the lighting device according to the second embodiment of the present invention (i.e., a graph obtained by plotting the values in Table 1).
Figure 13:
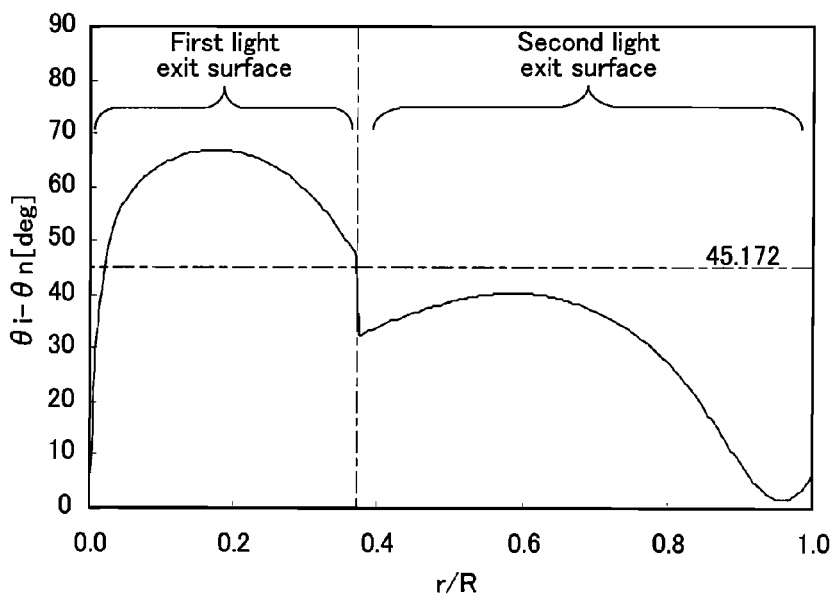
FIG. 13 is a graph showing a relationship between r/R and $\theta i - \theta n$ in Example 1 of the lighting device according to the second embodiment of the present invention.

FIG. 10 is a graph obtained by plotting the values of θi and sagY in Table 1. FIG. 13 is a graph showing a relationship between r/R and θi-θn. Here, r/R is a value obtained by normalizing, with respect to the outermost radius of the lens, the distance in the direction parallel to the light entrance surface 11 from the optical axis A to the arbitrary point on the light exit surface 12, where r is the distance in the direction parallel to the light entrance surface from the optical axis to the arbitrary point on the light exit surface, and R is the outermost radius of the lens (see FIG. 9).

θi-θn is an angle of a light ray emitted at an angle of θi, with respect to a normal line at a point on the light exit surface 12 reached by the light ray, that is, an incident angle of the light ray on the light exit surface 12. As a condition of the total reflection region 124 of the first light exit surface 121, since the refractive index of the transparent material constituting the lens in Example 1 is 1.41, θi-θn is 45.172 degrees or more. Accordingly, FIG. 13 shows that in Example 1, the transmissive region 123 of the first light exit surface 121 is a narrow region in the vicinity of the optical axis and the total reflection region 124 is a wide region away from the optical axis. FIG. 13 also shows that in Example 1, the entire second light exit surface 122 totally reflects the light emitted from the starting point Q.

In Example 1, d, θp, and a shown in FIG. 2 are 0.485 mm, 4.2 degrees, and 0.042 mm, respectively. Accordingly, a/(d×tan θp) is 1.17, and this value satisfies the above inequality (2).

Furthermore, in Example 1, d' and R shown in FIG. 2 are 0.48 mm and 1.95 mm, respectively. Accordingly, d'/2R is 0.12, and this value satisfies the above inequality (3).

Figure 16:
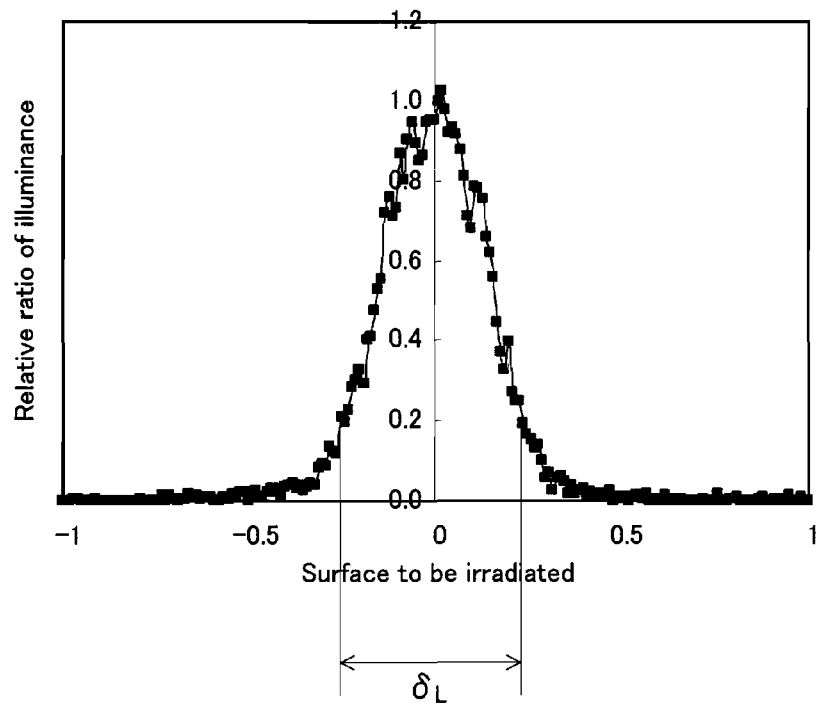
FIG. 16 shows an illuminance distribution in Example 1 of the lighting device according to the second embodiment of the present invention.
Figure 19:
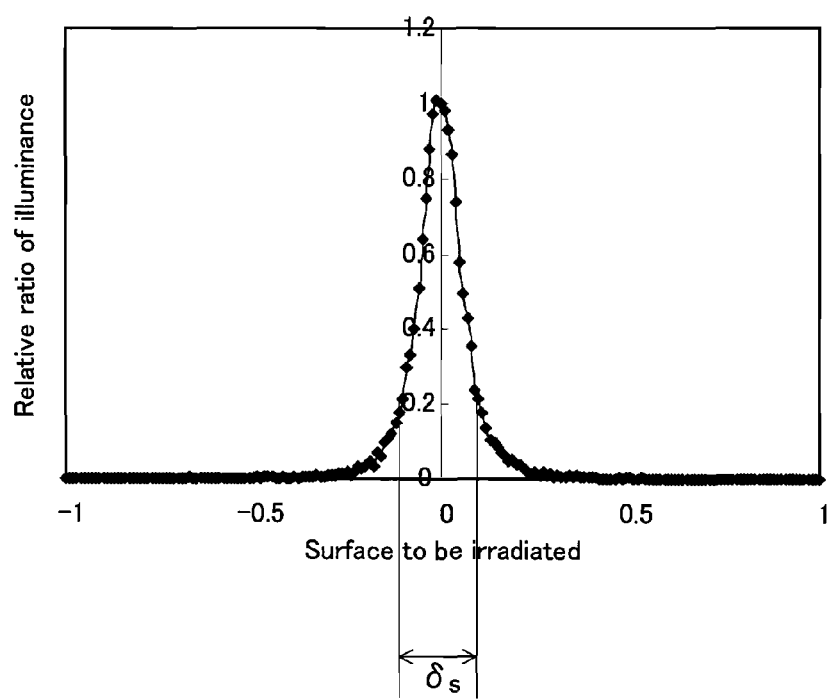
FIG. 19 shows an illuminance distribution obtained when only light emitting diodes are used to confirm the effects of Examples 1 to 3.

FIG. 16 shows the illuminance distribution on the surface to be irradiated obtained by calculation assuming that the lighting device of Example 1 (i.e., the illuminating lens in FIG. 10 and the light emitting diode) is used and the surface to be irradiated is placed at a distance of 8 mm from the light emitting diode. FIG. 19 shows the illuminance distribution on the surface to be irradiated obtained by calculation assuming that only the same light emitting diode as in FIG. 16 is used and the surface to be irradiated is placed at a distance of 8 mm from the light emitting diode. Each of FIG. 16 and FIG. 19 shows a curve indicating the distribution of illuminances on the surface to be irradiated when the illuminances are normalized with respect to the illuminance at the center of the optical axis being 1. A comparison between FIG. 16 and FIG. 19 shows that the illuminating lens is effective in increasing the illuminated area of the surface to be irradiated.

Furthermore, the distribution width $\delta_L$ of illuminances of 0.2 or more on the illuminance distribution curve in FIG. 16 is 0.48, and the distribution width $\delta_S$ of illuminances of 0.2 or more on the illuminance distribution curve in FIG. 19 is 0.2. Accordingly, $\delta_L/\delta_S$ is 2.4, which satisfies the above inequality (4).

Example 2

Table 2 below shows specific numerical values in Example 2.

TABLE 2

| θi | sagY |
|---|---|
| 0.00 | 0.647 |
| 0.57 | 0.647 |
| 1.14 | 0.648 |
| 1.71 | 0.649 |
| 2.27 | 0.650 |
| 2.83 | 0.652 |
| 3.39 | 0.653 |
| 3.94 | 0.656 |
| 4.48 | 0.658 |
| 5.02 | 0.661 |
| 5.55 | 0.664 |
| 6.07 | 0.667 |
| 6.59 | 0.670 |
| 7.09 | 0.674 |
| 7.59 | 0.678 |
| 8.07 | 0.682 |
| 8.55 | 0.686 |
| 9.02 | 0.691 |
| 9.48 | 0.695 |
| 9.93 | 0.700 |
| 10.37 | 0.705 |
| 10.80 | 0.710 |
| 11.22 | 0.715 |
| 11.64 | 0.720 |
| 12.04 | 0.726 |
| 12.44 | 0.731 |
| 12.83 | 0.736 |
| 13.21 | 0.742 |
| 13.58 | 0.748 |
| 13.94 | 0.753 |
| 14.30 | 0.759 |
| 14.65 | 0.765 |
| 14.99 | 0.771 |
| 15.33 | 0.776 |
| 15.66 | 0.782 |
| 15.98 | 0.788 |
| 16.30 | 0.794 |
| 16.61 | 0.800 |
| 16.91 | 0.806 |
| 17.21 | 0.812 |
| 17.51 | 0.818 |
| 17.79 | 0.824 |
| 18.08 | 0.830 |
| 18.35 | 0.836 |
| 18.63 | 0.842 |
| 18.89 | 0.848 |
| 19.16 | 0.854 |
| 19.42 | 0.860 |
| 19.67 | 0.866 |
| 19.92 | 0.872 |
| 20.17 | 0.878 |
| 20.42 | 0.884 |
| 20.66 | 0.890 |
| 20.89 | 0.896 |
| 21.13 | 0.901 |
| 21.36 | 0.907 |
| 21.58 | 0.913 |
| 21.81 | 0.919 |
| 22.03 | 0.925 |
| 22.25 | 0.930 |
| 22.46 | 0.936 |
| 22.67 | 0.942 |
| 22.88 | 0.947 |
| 23.09 | 0.953 |
| 23.30 | 0.959 |
| 23.50 | 0.964 |
| 23.70 | 0.970 |
| 23.90 | 0.975 |
| 24.10 | 0.981 |
| 24.30 | 0.986 |
| 24.49 | 0.991 |
| 24.68 | 0.997 |
| 24.87 | 1.002 |
| 25.06 | 1.007 |
| 25.25 | 1.012 |
| 25.43 | 1.017 |
| 25.62 | 1.022 |
| 25.80 | 1.027 |
| 25.99 | 1.032 |
| 26.17 | 1.037 |
| 26.35 | 1.042 |
| 26.53 | 1.047 |
| 26.70 | 1.051 |
| 26.88 | 1.056 |
| 27.06 | 1.061 |
| 27.23 | 1.065 |
| 27.41 | 1.070 |
| 27.58 | 1.074 |

TABLE 2-continued

| θi | sagY |
|---|---|
| 27.75 | 1.079 |
| 27.93 | 1.083 |
| 28.10 | 1.087 |
| 28.27 | 1.091 |
| 28.44 | 1.096 |
| 28.61 | 1.100 |
| 28.78 | 1.104 |
| 28.95 | 1.108 |
| 29.12 | 1.111 |
| 29.29 | 1.115 |
| 29.46 | 1.119 |
| 29.63 | 1.123 |
| 29.80 | 1.126 |
| 29.97 | 1.130 |
| 30.14 | 1.133 |
| 30.31 | 1.136 |
| 30.49 | 1.139 |
| 30.73 | 1.139 |
| 30.98 | 1.139 |
| 31.22 | 1.139 |
| 31.46 | 1.139 |
| 31.70 | 1.138 |
| 31.94 | 1.138 |
| 32.18 | 1.138 |
| 32.41 | 1.138 |
| 32.65 | 1.137 |
| 32.88 | 1.137 |
| 33.12 | 1.137 |
| 33.35 | 1.137 |
| 33.58 | 1.137 |
| 33.81 | 1.136 |
| 34.04 | 1.136 |
| 34.27 | 1.136 |
| 34.50 | 1.136 |
| 34.73 | 1.135 |
| 34.95 | 1.135 |
| 35.18 | 1.135 |
| 35.40 | 1.135 |
| 35.62 | 1.134 |
| 35.84 | 1.134 |
| 36.06 | 1.134 |
| 36.28 | 1.133 |
| 36.50 | 1.133 |
| 36.72 | 1.133 |
| 36.94 | 1.132 |
| 37.15 | 1.132 |
| 37.37 | 1.132 |
| 37.58 | 1.131 |
| 37.79 | 1.131 |
| 38.01 | 1.131 |
| 38.22 | 1.130 |
| 38.43 | 1.130 |
| 38.64 | 1.130 |
| 38.85 | 1.129 |
| 39.05 | 1.129 |
| 39.26 | 1.128 |
| 39.47 | 1.128 |
| 39.67 | 1.128 |
| 39.88 | 1.127 |
| 40.08 | 1.127 |
| 40.28 | 1.126 |
| 40.48 | 1.126 |
| 40.69 | 1.125 |
| 40.89 | 1.125 |
| 41.09 | 1.124 |
| 41.28 | 1.124 |
| 41.48 | 1.123 |
| 41.68 | 1.123 |
| 41.88 | 1.122 |
| 42.07 | 1.122 |
| 42.27 | 1.121 |
| 42.46 | 1.121 |
| 42.65 | 1.120 |
| 42.85 | 1.120 |
| 43.04 | 1.119 |
| 43.23 | 1.118 |
| 43.42 | 1.118 |
| 43.61 | 1.117 |

TABLE 2-continued

| θi | sagY |
|---|---|
| 43.80 | 1.117 |
| 43.99 | 1.116 |
| 44.18 | 1.115 |
| 44.36 | 1.114 |
| 44.55 | 1.114 |
| 44.74 | 1.113 |
| 44.92 | 1.112 |
| 45.11 | 1.112 |
| 45.29 | 1.111 |
| 45.48 | 1.110 |
| 45.66 | 1.109 |
| 45.84 | 1.108 |
| 46.03 | 1.108 |
| 46.21 | 1.107 |
| 46.39 | 1.106 |
| 46.57 | 1.105 |
| 46.75 | 1.104 |
| 46.93 | 1.103 |
| 47.11 | 1.102 |
| 47.29 | 1.101 |
| 47.47 | 1.100 |
| 47.65 | 1.099 |
| 47.83 | 1.098 |
| 48.01 | 1.097 |
| 48.18 | 1.096 |
| 48.36 | 1.095 |
| 48.54 | 1.094 |
| 48.71 | 1.093 |
| 48.89 | 1.092 |
| 49.07 | 1.091 |
| 49.24 | 1.090 |
| 49.42 | 1.088 |
| 49.59 | 1.087 |
| 49.77 | 1.086 |
| 49.94 | 1.085 |
| 50.12 | 1.083 |
| 50.29 | 1.082 |
| 50.47 | 1.081 |
| 50.64 | 1.079 |
| 50.82 | 1.078 |
| 50.99 | 1.076 |
| 51.16 | 1.075 |
| 51.34 | 1.073 |
| 51.51 | 1.072 |
| 51.69 | 1.070 |
| 51.86 | 1.069 |
| 52.03 | 1.067 |
| 52.21 | 1.065 |
| 52.38 | 1.064 |
| 52.56 | 1.062 |
| 52.73 | 1.060 |
| 52.91 | 1.058 |
| 53.08 | 1.056 |
| 53.26 | 1.055 |
| 53.43 | 1.053 |
| 53.61 | 1.051 |
| 53.78 | 1.049 |
| 53.96 | 1.047 |
| 54.13 | 1.045 |
| 54.31 | 1.042 |
| 54.49 | 1.040 |
| 54.66 | 1.038 |
| 54.84 | 1.036 |
| 55.02 | 1.034 |
| 55.19 | 1.031 |
| 55.37 | 1.029 |
| 55.55 | 1.026 |
| 55.73 | 1.024 |
| 55.91 | 1.021 |
| 56.09 | 1.019 |
| 56.27 | 1.016 |
| 56.45 | 1.014 |
| 56.63 | 1.011 |
| 56.82 | 1.008 |
| 57.00 | 1.005 |
| 57.18 | 1.002 |
| 57.37 | 0.999 |
| 57.55 | 0.996 |

TABLE 2-continued

| θi | sagY |
|---|---|
| 57.74 | 0.993 |
| 57.93 | 0.990 |
| 58.11 | 0.987 |
| 58.30 | 0.984 |
| 58.49 | 0.981 |
| 58.68 | 0.977 |
| 58.87 | 0.974 |
| 59.06 | 0.970 |
| 59.26 | 0.967 |
| 59.45 | 0.963 |
| 59.64 | 0.959 |
| 59.84 | 0.956 |
| 60.04 | 0.952 |
| 60.23 | 0.948 |
| 60.43 | 0.944 |
| 60.63 | 0.940 |
| 60.83 | 0.936 |
| 61.04 | 0.932 |
| 61.24 | 0.927 |
| 61.45 | 0.923 |
| 61.65 | 0.919 |
| 61.86 | 0.914 |
| 62.07 | 0.910 |
| 62.28 | 0.905 |
| 62.49 | 0.900 |
| 62.71 | 0.895 |
| 62.92 | 0.890 |
| 63.14 | 0.885 |
| 63.36 | 0.880 |
| 63.58 | 0.875 |
| 63.80 | 0.870 |
| 64.02 | 0.864 |
| 64.24 | 0.859 |
| 64.47 | 0.853 |
| 64.70 | 0.848 |
| 64.93 | 0.842 |
| 65.16 | 0.836 |
| 65.39 | 0.830 |
| 65.63 | 0.824 |
| 65.87 | 0.818 |
| 66.11 | 0.811 |
| 66.35 | 0.805 |
| 66.59 | 0.799 |
| 66.84 | 0.792 |
| 67.09 | 0.785 |
| 67.34 | 0.778 |
| 67.59 | 0.771 |
| 67.85 | 0.764 |
| 68.10 | 0.757 |
| 68.36 | 0.750 |
| 68.62 | 0.742 |
| 68.89 | 0.735 |
| 69.15 | 0.727 |
| 69.42 | 0.719 |
| 69.70 | 0.711 |
| 69.97 | 0.703 |
| 70.25 | 0.695 |
| 70.53 | 0.687 |
| 70.81 | 0.678 |
| 71.09 | 0.669 |
| 71.38 | 0.661 |
| 71.67 | 0.652 |
| 71.96 | 0.643 |
| 72.26 | 0.633 |
| 72.56 | 0.624 |
| 72.86 | 0.615 |
| 73.17 | 0.605 |
| 73.47 | 0.595 |
| 73.79 | 0.585 |
| 74.10 | 0.575 |
| 74.42 | 0.565 |
| 74.74 | 0.554 |
| 75.06 | 0.544 |
| 75.39 | 0.533 |
| 75.72 | 0.522 |
| 76.05 | 0.511 |
| 76.39 | 0.500 |
| 76.73 | 0.488 |
| 77.07 | 0.477 |
| 77.42 | 0.465 |
| 77.77 | 0.453 |
| 78.12 | 0.441 |
| 78.47 | 0.000 |
| 78.83 | 0.000 |
| 79.20 | 0.000 |
| 79.57 | 0.000 |
| 79.94 | 0.000 |
| 80.31 | 0.000 |
| 80.69 | 0.000 |
| 81.07 | 0.000 |
| 81.45 | 0.000 |
| 81.84 | 0.000 |
| 82.23 | 0.000 |
| 82.63 | 0.000 |
| 83.03 | 0.000 |
| 83.43 | 0.000 |
| 83.84 | 0.000 |
| 84.25 | 0.000 |
| 84.66 | 0.000 |
| 85.08 | 0.000 |
| 85.50 | 0.000 |
| 85.92 | 0.000 |
| 86.35 | 0.000 |
| 86.78 | 0.000 |
| 87.21 | 0.000 |
| 87.65 | 0.000 |
| 88.09 | 0.000 |
| 88.54 | 0.000 |
| 88.99 | 0.000 |
| 89.44 | 0.000 |
| 89.89 | 0.000 |

Figure 11:
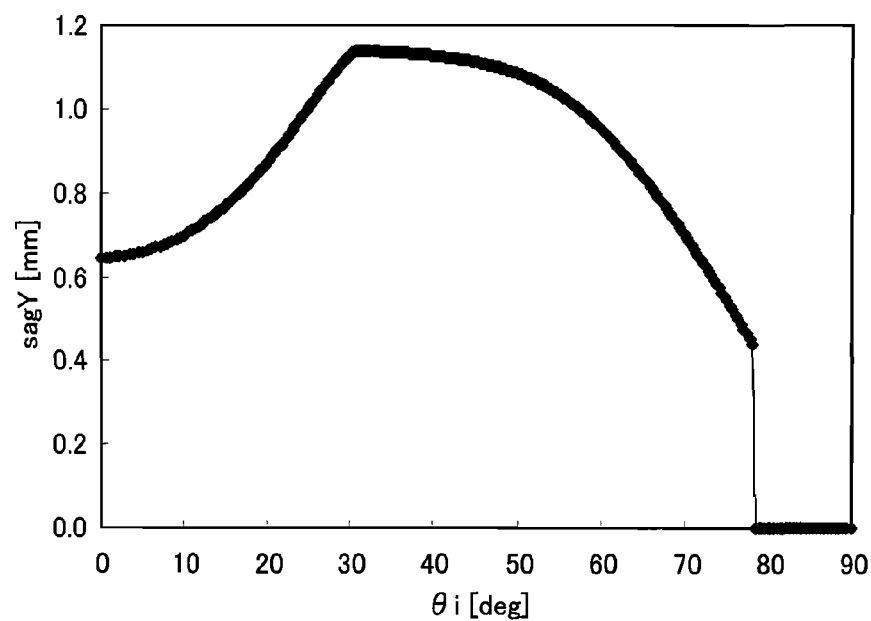
FIG. 11 is a graph showing a relationship between $\theta i$ and sagY, which represent the shape of the light exit surface in Example 2 of the lighting device according to the second embodiment of the present invention (i.e., a graph obtained by plotting the values in Table 2).
Figure 14:
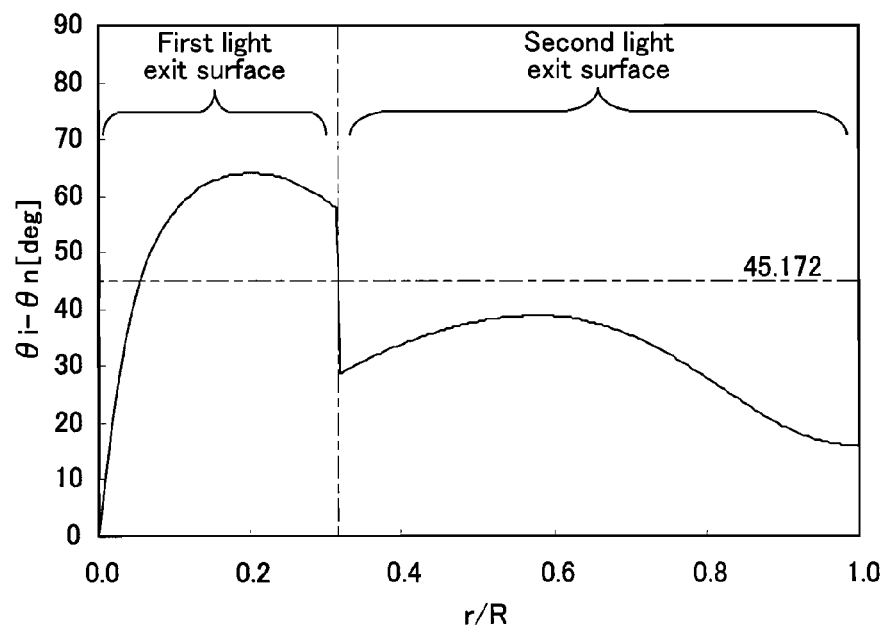
FIG. 14 is a graph showing a relationship between r/R and $\theta i - \theta n$ in Example 2 of the lighting device according to the second embodiment of the present invention.

FIG. 11 is a graph obtained by plotting the values of θi and sagY in Table 2. FIG. 14 is a graph showing a relationship between r/R and θi-θn. r/R and θi-θn in FIG. 14 are the same as those in FIG. 13.

In Example 2, the lens is made of a material having a refractive index of 1.41, as in the case of Example 1 described above. Accordingly, as a condition of the total reflection region 124 of the first light exit surface 121, θi-θn is 45.172 degrees or more, as in the case of Example 1. Accordingly, FIG. 14 shows that in Example 2, the transmissive region 123 is wider than that of Example 1, and the total reflection region 124 is narrower than that of Example 1. FIG. 14 also shows that in Example 2, the entire second light exit surface 122 totally reflects the light emitted from the starting point Q.

In Example 2, d, θp, and a shown in FIG. 2 are 0.647 mm, 9.3 degrees, and 0.123 mm, respectively. Accordingly, a/(d× tan θp) is 1.16, and this value satisfies the above inequality (2).

Furthermore, in Example 2, d' and R shown in FIG. 2 are 0.642 mm and 2.1 mm, respectively. Accordingly, d'/2R is 0.15, and this value satisfies the above inequality (3).

Figure 17:
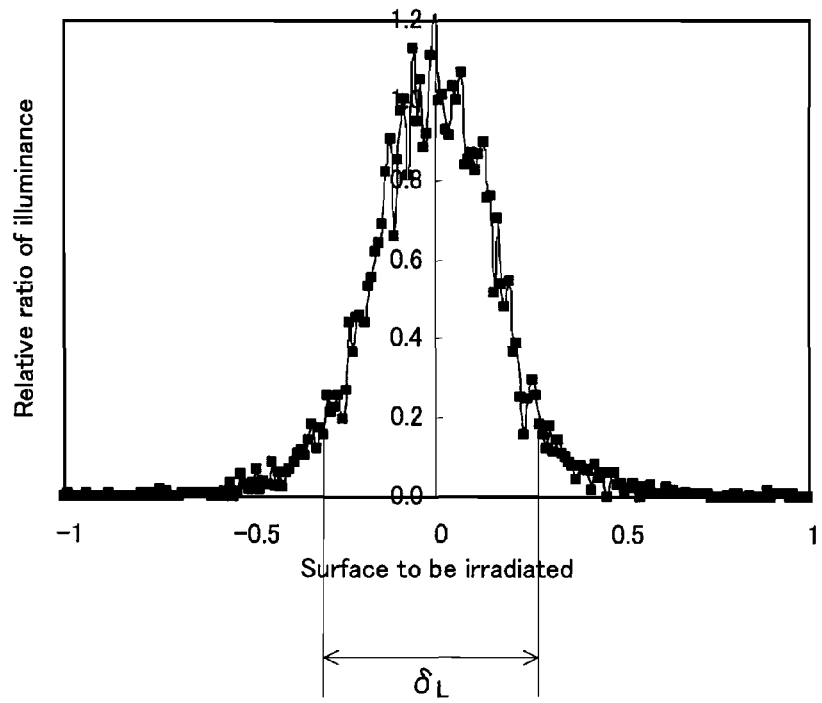
FIG. 17 shows an illuminance distribution in Example 2 of the lighting device according to the second embodiment of the present invention.

FIG. 17 shows the illuminance distribution on the surface to be irradiated obtained by calculation assuming that the lighting device of Example 2 (i.e., the illuminating lens in FIG. 11 and the light emitting diode) is used and the surface to be irradiated is placed at a distance of 8 mm from the light emitting diode. FIG. 17 shows a curve indicating the distribution of illuminances on the surface to be irradiated when the illuminances are normalized with respect to the illuminance at the center of the optical axis being 1, as in the case of FIG. 16. A comparison between FIG. 17 and FIG. 19 shows that the illuminating lens is effective in increasing the illuminated area of the surface to be irradiated.

Furthermore, the distribution width $\delta_L$ of illuminances of 0.2 or more on the illuminance distribution curve in FIG. 17 is 0.5. Accordingly, $\delta_L/\delta_S$ is 2.5, which satisfies the above inequality (4).

Example 3

Table 3 below shows specific numerical values in Example 3.

TABLE 3

| θi | sagY |
|---|---|
| 0.000 | 0.800 |
| 0.462 | 0.800 |
| 0.922 | 0.802 |
| 1.379 | 0.804 |
| 1.833 | 0.806 |
| 2.282 | 0.809 |
| 2.725 | 0.813 |
| 3.163 | 0.817 |
| 3.595 | 0.821 |
| 4.021 | 0.826 |
| 4.441 | 0.830 |
| 4.855 | 0.835 |
| 5.262 | 0.840 |
| 5.664 | 0.845 |
| 6.059 | 0.851 |
| 6.449 | 0.856 |
| 6.833 | 0.861 |
| 7.211 | 0.867 |
| 7.583 | 0.872 |
| 7.949 | 0.878 |
| 8.311 | 0.883 |
| 8.666 | 0.889 |
| 9.017 | 0.894 |
| 9.362 | 0.900 |
| 9.703 | 0.905 |
| 10.038 | 0.911 |
| 10.368 | 0.917 |
| 10.694 | 0.922 |
| 11.014 | 0.928 |
| 11.331 | 0.933 |
| 11.642 | 0.939 |
| 11.950 | 0.945 |
| 12.253 | 0.950 |
| 12.551 | 0.956 |
| 12.846 | 0.962 |
| 13.136 | 0.967 |
| 13.423 | 0.973 |
| 13.706 | 0.979 |
| 13.984 | 0.984 |
| 14.260 | 0.990 |
| 14.531 | 0.995 |
| 14.799 | 1.001 |
| 15.064 | 1.007 |
| 15.325 | 1.012 |
| 15.583 | 1.018 |
| 15.837 | 1.023 |
| 16.089 | 1.029 |
| 16.337 | 1.034 |
| 16.583 | 1.040 |
| 16.825 | 1.045 |
| 17.065 | 1.051 |
| 17.302 | 1.056 |
| 17.536 | 1.061 |
| 17.768 | 1.067 |
| 17.997 | 1.072 |
| 18.224 | 1.077 |
| 18.448 | 1.083 |
| 18.670 | 1.088 |
| 18.889 | 1.093 |
| 19.107 | 1.099 |
| 19.322 | 1.104 |
| 19.535 | 1.109 |
| 19.746 | 1.114 |
| 19.955 | 1.119 |
| 20.162 | 1.124 |

TABLE 3-continued

| θi | sagY |
|---|---|
| 20.367 | 1.129 |
| 20.571 | 1.134 |
| 20.772 | 1.139 |
| 20.972 | 1.144 |
| 21.171 | 1.149 |
| 21.368 | 1.154 |
| 21.563 | 1.159 |
| 21.757 | 1.164 |
| 21.949 | 1.168 |
| 22.140 | 1.173 |
| 22.330 | 1.178 |
| 22.518 | 1.182 |
| 22.705 | 1.187 |
| 22.892 | 1.191 |
| 23.076 | 1.196 |
| 23.260 | 1.200 |
| 23.443 | 1.205 |
| 23.625 | 1.209 |
| 23.806 | 1.213 |
| 23.986 | 1.218 |
| 24.165 | 1.222 |
| 24.344 | 1.226 |
| 24.522 | 1.230 |
| 24.699 | 1.234 |
| 24.875 | 1.238 |
| 25.051 | 1.242 |
| 25.226 | 1.246 |
| 25.401 | 1.250 |
| 25.575 | 1.253 |
| 25.749 | 1.257 |
| 25.922 | 1.261 |
| 26.095 | 1.264 |
| 26.290 | 1.266 |
| 26.499 | 1.268 |
| 26.706 | 1.269 |
| 26.913 | 1.271 |
| 27.117 | 1.272 |
| 27.321 | 1.274 |
| 27.523 | 1.275 |
| 27.724 | 1.276 |
| 27.923 | 1.278 |
| 28.122 | 1.279 |
| 28.318 | 1.281 |
| 28.514 | 1.282 |
| 28.709 | 1.284 |
| 28.902 | 1.285 |
| 29.094 | 1.287 |
| 29.284 | 1.288 |
| 29.474 | 1.290 |
| 29.662 | 1.291 |
| 29.849 | 1.293 |
| 30.035 | 1.294 |
| 30.220 | 1.296 |
| 30.404 | 1.297 |
| 30.586 | 1.299 |
| 30.768 | 1.300 |
| 30.949 | 1.302 |
| 31.128 | 1.303 |
| 31.306 | 1.305 |
| 31.484 | 1.306 |
| 31.660 | 1.307 |
| 31.836 | 1.309 |
| 32.010 | 1.310 |
| 32.184 | 1.312 |
| 32.356 | 1.313 |
| 32.528 | 1.315 |
| 32.699 | 1.316 |
| 32.869 | 1.318 |
| 33.038 | 1.319 |
| 33.206 | 1.320 |
| 33.374 | 1.322 |
| 33.541 | 1.323 |
| 33.706 | 1.325 |
| 33.872 | 1.326 |
| 34.036 | 1.327 |
| 34.200 | 1.329 |
| 34.363 | 1.330 |
| 34.525 | 1.331 |

TABLE 3-continued

| θi | sagY |
|---|---|
| 34.687 | 1.333 |
| 34.848 | 1.334 |
| 35.009 | 1.335 |
| 35.168 | 1.337 |
| 35.328 | 1.338 |
| 35.486 | 1.339 |
| 35.645 | 1.340 |
| 35.802 | 1.341 |
| 35.959 | 1.343 |
| 36.116 | 1.344 |
| 36.272 | 1.345 |
| 36.428 | 1.346 |
| 36.583 | 1.347 |
| 36.738 | 1.348 |
| 36.892 | 1.349 |
| 37.046 | 1.350 |
| 37.199 | 1.351 |
| 37.352 | 1.352 |
| 37.505 | 1.353 |
| 37.658 | 1.354 |
| 37.810 | 1.355 |
| 37.962 | 1.356 |
| 38.113 | 1.357 |
| 38.264 | 1.357 |
| 38.415 | 1.358 |
| 38.566 | 1.359 |
| 38.716 | 1.360 |
| 38.866 | 1.361 |
| 39.016 | 1.361 |
| 39.166 | 1.362 |
| 39.316 | 1.363 |
| 39.465 | 1.363 |
| 39.614 | 1.364 |
| 39.763 | 1.364 |
| 39.912 | 1.365 |
| 40.060 | 1.365 |
| 40.209 | 1.366 |
| 40.357 | 1.366 |
| 40.505 | 1.367 |
| 40.653 | 1.367 |
| 40.8007 | 1.367 |
| 40.9485 | 1.368 |
| 41.0961 | 1.368 |
| 41.2436 | 1.368 |
| 41.3910 | 1.369 |
| 41.5383 | 1.369 |
| 41.6856 | 1.369 |
| 41.8327 | 1.369 |
| 41.9797 | 1.369 |
| 42.1267 | 1.369 |
| 42.2736 | 1.369 |
| 42.4205 | 1.369 |
| 42.5672 | 1.369 |
| 42.7139 | 1.369 |
| 42.8606 | 1.369 |
| 43.0072 | 1.369 |
| 43.1537 | 1.369 |
| 43.3002 | 1.369 |
| 43.4466 | 1.369 |
| 43.5930 | 1.369 |
| 43.7393 | 1.368 |
| 43.8856 | 1.368 |
| 44.0318 | 1.368 |
| 44.1780 | 1.367 |
| 44.3241 | 1.367 |
| 44.4702 | 1.367 |
| 44.6163 | 1.366 |
| 44.7623 | 1.366 |
| 44.9083 | 1.365 |
| 45.0542 | 1.365 |
| 45.2001 | 1.364 |
| 45.3460 | 1.364 |
| 45.4918 | 1.363 |
| 45.6375 | 1.363 |
| 45.7833 | 1.362 |
| 45.9290 | 1.361 |
| 46.0746 | 1.361 |
| 46.2202 | 1.360 |

TABLE 3-continued

| θi | sagY |
|---|---|
| 46.3658 | 1.359 |
| 46.5113 | 1.358 |
| 46.6568 | 1.357 |
| 46.8023 | 1.357 |
| 46.9477 | 1.356 |
| 47.0931 | 1.355 |
| 47.2385 | 1.354 |
| 47.3838 | 1.353 |
| 47.5291 | 1.352 |
| 47.6744 | 1.351 |
| 47.8196 | 1.350 |
| 47.9648 | 1.349 |
| 48.1100 | 1.348 |
| 48.2552 | 1.347 |
| 48.4004 | 1.346 |
| 48.5455 | 1.345 |
| 48.6907 | 1.343 |
| 48.8358 | 1.342 |
| 48.9809 | 1.341 |
| 49.1261 | 1.340 |
| 49.2712 | 1.338 |
| 49.4164 | 1.337 |
| 49.5615 | 1.336 |
| 49.707 | 1.334 |
| 49.852 | 1.333 |
| 49.997 | 1.332 |
| 50.143 | 1.330 |
| 50.288 | 1.329 |
| 50.433 | 1.327 |
| 50.579 | 1.326 |
| 50.724 | 1.324 |
| 50.870 | 1.322 |
| 51.016 | 1.321 |
| 51.162 | 1.319 |
| 51.308 | 1.317 |
| 51.454 | 1.316 |
| 51.600 | 1.314 |
| 51.746 | 1.312 |
| 51.893 | 1.310 |
| 52.040 | 1.308 |
| 52.187 | 1.306 |
| 52.334 | 1.305 |
| 52.481 | 1.303 |
| 52.628 | 1.301 |
| 52.776 | 1.299 |
| 52.924 | 1.296 |
| 53.073 | 1.294 |
| 53.221 | 1.292 |
| 53.370 | 1.290 |
| 53.519 | 1.288 |
| 53.669 | 1.285 |
| 53.819 | 1.283 |
| 53.969 | 1.281 |
| 54.119 | 1.278 |
| 54.270 | 1.276 |
| 54.422 | 1.273 |
| 54.574 | 1.271 |
| 54.726 | 1.268 |
| 54.879 | 1.266 |
| 55.032 | 1.263 |
| 55.185 | 1.260 |
| 55.340 | 1.258 |
| 55.494 | 1.255 |
| 55.649 | 1.252 |
| 55.805 | 1.249 |
| 55.962 | 1.246 |
| 56.119 | 1.243 |
| 56.276 | 1.240 |
| 56.434 | 1.237 |
| 56.593 | 1.234 |
| 56.752 | 1.230 |
| 56.913 | 1.227 |
| 57.073 | 1.224 |
| 57.235 | 1.220 |
| 57.397 | 1.217 |
| 57.560 | 1.213 |
| 57.723 | 1.210 |
| 57.888 | 1.206 |

TABLE 3-continued

| θi | sagY |
|---|---|
| 58.053 | 1.203 |
| 58.219 | 1.199 |
| 58.386 | 1.195 |
| 58.553 | 1.191 |
| 58.721 | 1.187 |
| 58.891 | 1.183 |
| 59.060 | 1.179 |
| 59.231 | 1.175 |
| 59.403 | 1.171 |
| 59.575 | 1.167 |
| 59.749 | 1.162 |
| 59.923 | 1.158 |
| 60.098 | 1.154 |
| 60.274 | 1.149 |
| 60.451 | 1.144 |
| 60.629 | 1.140 |
| 60.808 | 1.135 |
| 60.988 | 1.130 |
| 61.169 | 1.126 |
| 61.350 | 1.121 |
| 61.533 | 1.116 |
| 61.717 | 1.111 |
| 61.902 | 1.105 |
| 62.088 | 1.100 |
| 62.275 | 1.095 |
| 62.463 | 1.090 |
| 62.652 | 1.084 |
| 62.842 | 1.079 |
| 63.033 | 1.073 |
| 63.226 | 1.067 |
| 63.420 | 1.062 |
| 63.615 | 1.056 |
| 63.812 | 1.050 |
| 64.010 | 1.044 |
| 64.209 | 1.038 |
| 64.410 | 1.032 |
| 64.612 | 1.025 |
| 64.816 | 1.019 |
| 65.022 | 1.013 |
| 65.230 | 1.006 |
| 65.439 | 0.999 |
| 65.651 | 0.992 |
| 65.865 | 0.985 |
| 66.080 | 0.978 |
| 66.299 | 0.971 |
| 66.520 | 0.964 |
| 66.743 | 0.956 |
| 66.970 | 0.949 |
| 67.199 | 0.941 |
| 67.432 | 0.933 |
| 67.668 | 0.925 |
| 67.909 | 0.916 |
| 68.153 | 0.908 |
| 68.401 | 0.899 |
| 68.654 | 0.890 |
| 68.912 | 0.880 |
| 69.176 | 0.871 |
| 69.445 | 0.861 |
| 69.720 | 0.851 |
| 70.002 | 0.840 |
| 70.291 | 0.829 |
| 70.588 | 0.818 |
| 70.892 | 0.807 |
| 71.206 | 0.795 |
| 71.528 | 0.782 |
| 71.861 | 0.769 |
| 72.205 | 0.756 |
| 72.560 | 0.742 |
| 72.927 | 0.727 |
| 73.308 | 0.712 |
| 73.703 | 0.696 |
| 74.113 | 0.679 |
| 74.539 | 0.662 |
| 74.983 | 0.644 |
| 75.445 | 0.625 |
| 75.927 | 0.605 |
| 76.430 | 0.584 |
| 76.957 | 0.562 |
| 77.507 | 0.539 |
| 78.083 | 0.515 |
| 78.686 | 0.489 |
| 79.319 | 0.462 |
| 79.983 | 0.434 |
| 80.680 | 0.404 |
| 81.412 | 0.373 |
| 82.181 | 0.340 |
| 82.990 | 0.305 |
| 83.841 | 0.269 |
| 84.735 | 0.230 |
| 85.676 | 0.189 |
| 86.666 | 0.146 |
| 87.707 | 0.101 |
| 88.801 | 0.053 |
| 89.952 | 0.002 |

Figure 12:
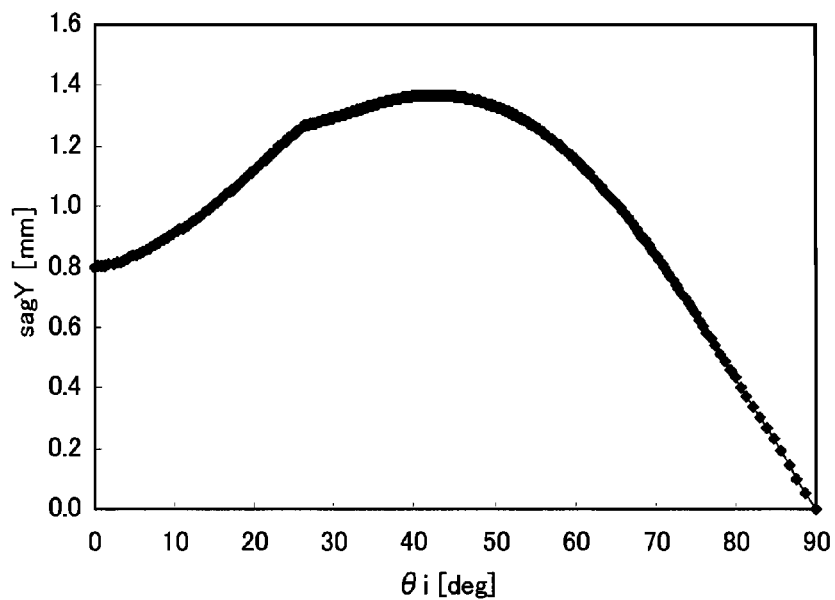
FIG. 12 is a graph showing a relationship between $\theta i$ and sagY, which represent the shape of the light exit surface in Example 3 of the lighting device according to the second embodiment of the present invention (i.e., a graph obtained by plotting the values in Table 3).
Figure 15:
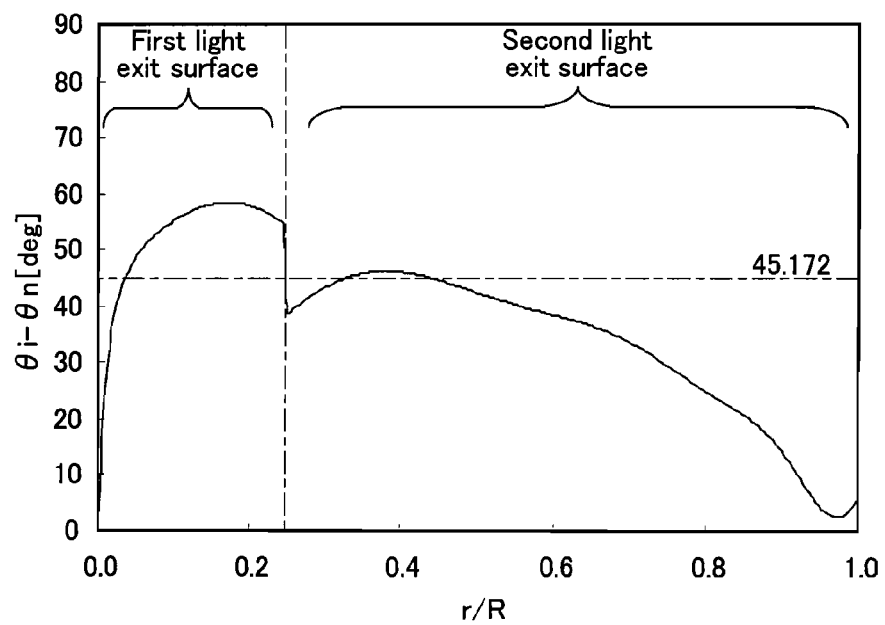
FIG. 15 is a graph showing a relationship between r/R and $\theta i - \theta n$ in Example 3 of the lighting device according to the second embodiment of the present invention.

FIG. 12 is a graph obtained by plotting the values of θi and sagY in Table 3. FIG. 15 is a graph showing a relationship between r/R and θi-θn. r/R and θi-θn in FIG. 15 are the same as those in FIG. 13.

In Example 3, the lens is made of a material having a refractive index of 1.41, as in the case of Example 1 described above. Accordingly, as a condition of the total reflection region 124 of the first light exit surface 121, θi-θn is 45,172 degrees or more, as in the case of Example 1. Accordingly, FIG. 15 shows that in Example 3, the transmissive region 123 is wider than that of Example 1, and the total reflection region 124 is narrower than that of Example 1. FIG. 15 also shows that in Example 3, the second light exit surface 122 totally reflects a part of the light emitted from the starting point Q and transmits the remaining part of the light.

In Example 3, d, θp, and a shown in FIG. 2 are 0.8 mm, 6.0 degrees, and 0.103 mm, respectively. Accordingly, a/(d×tan θp) is 1.22, and this value satisfies the above inequality (2).

Furthermore, in Example 3, d' and R shown in FIG. 2 are 0.795 mm and 2.55 mm, respectively. Accordingly, d'/2R is 0.16, and this value satisfies the above inequality (3).

Figure 18:
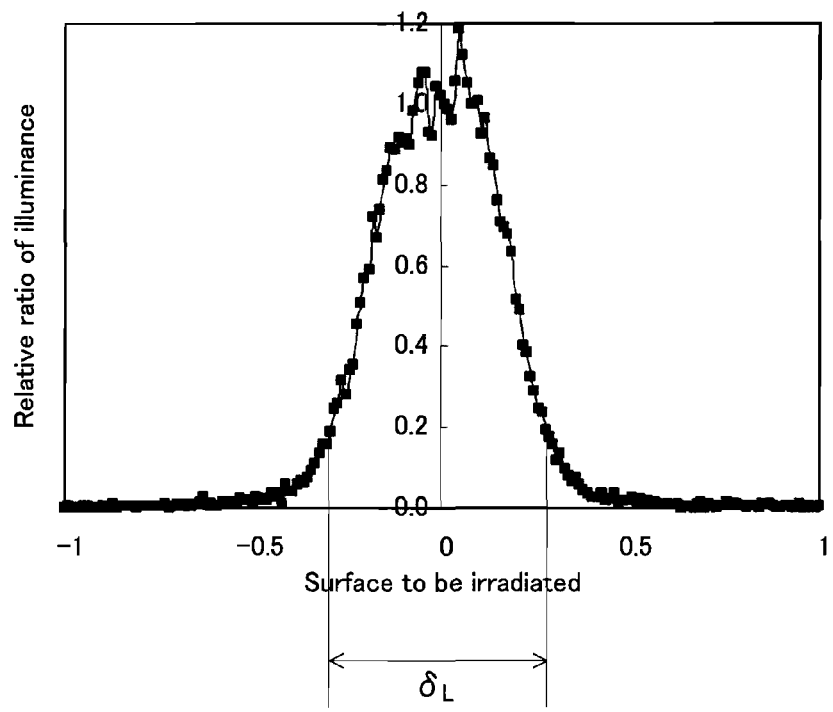
FIG. 18 shows an illuminance distribution in Example 3 of the lighting device according to the second embodiment of the present invention.

FIG. 18 shows the illuminance distribution on the surface to be irradiated obtained by calculation assuming that the lighting device of Example 3 (i.e., the illuminating lens in FIG. 12 and the light emitting diode) is used and the surface to be irradiated is placed at a distance of 8 mm from the light emitting diode. FIG. 18 shows a curve indicating the distribution of illuminances on the surface to be irradiated when the illuminances are normalized with respect to the illuminance at the center of the optical axis being 1, as in the case of FIG. 16. A comparison between FIG. 18 and FIG. 19 shows that the illuminating lens is effective in increasing the illuminated area of the surface to be irradiated.

Furthermore, the distribution width $\delta_L$ of illuminances of 0.2 or more on the illuminance distribution curve in FIG. 18 is 0.56. Accordingly, $\delta_L/\delta_S$ is 2.8, which satisfies the above inequality (4).

Third Embodiment

Figure 20:
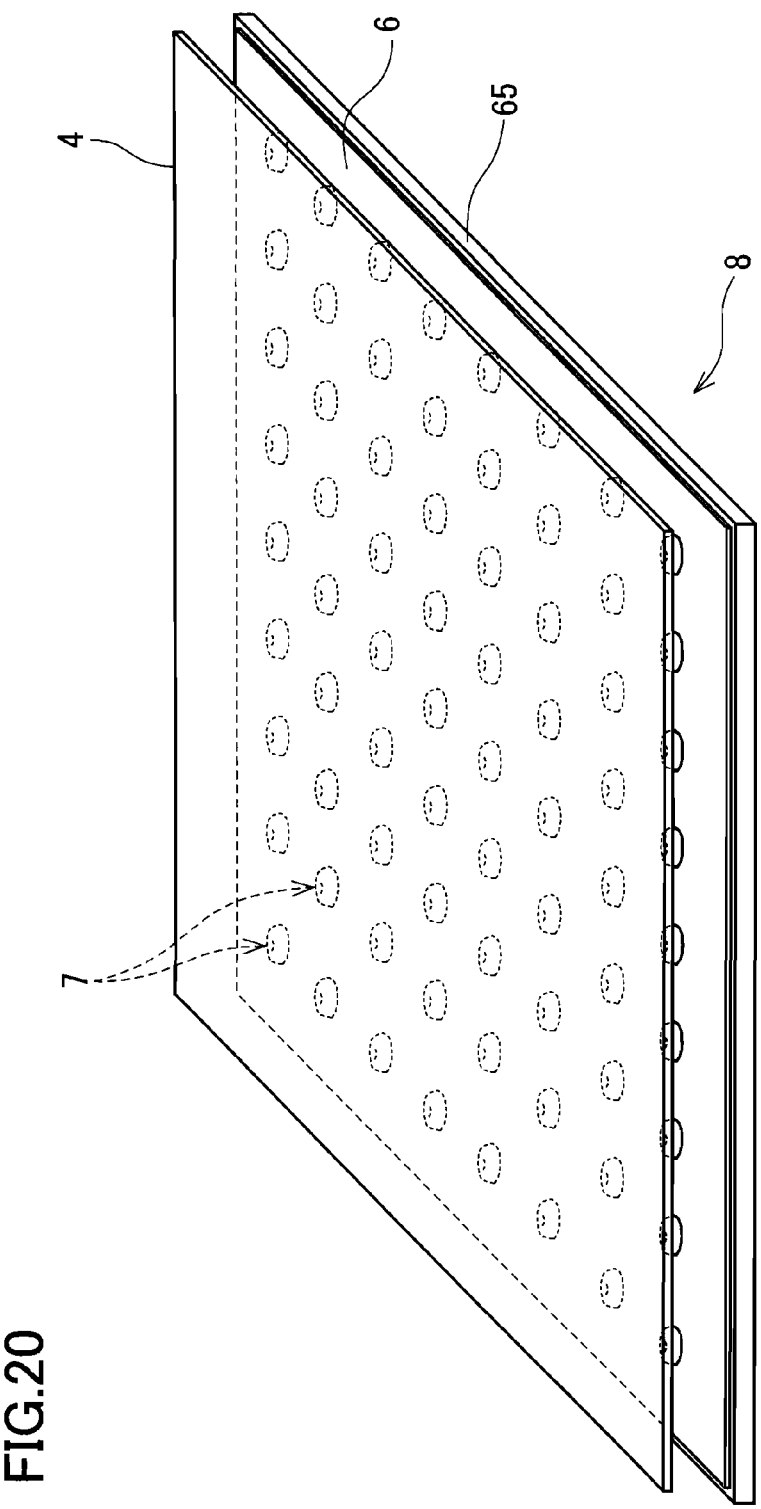
FIG. 20 is a schematic diagram of a surface light source according to a third embodiment of the present invention.

FIG. 20 is a schematic diagram of a surface light source 8 according to a third embodiment of the present invention. This surface light source 8 includes a plurality of lighting devices 7 of the second embodiment arranged in a plane, and a diffusing plate 4 disposed to cover the plurality of lighting devices 7. The lighting devices 7 may be arranged in a matrix as shown in FIG. 20. They may be arranged in a staggered manner.

Figure 21:
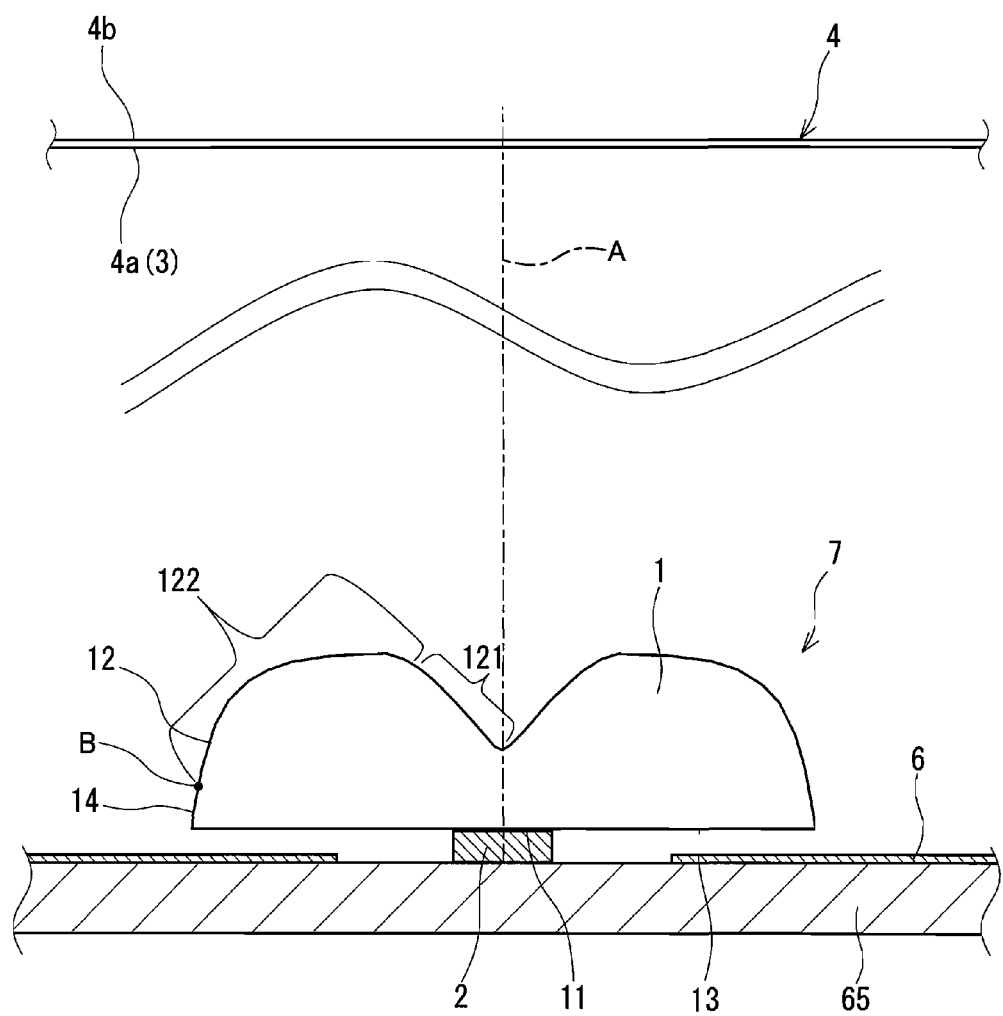
FIG. 21 is a partial cross-sectional view of the surface light source according to the third embodiment of the present invention.

The surface light source 8 includes a substrate 65 facing the diffusing plate 4 with the lighting devices 7 being disposed therebetween. As shown in FIG. 21, the light emitting diode 2 of each lighting device 7 is mounted on the substrate 65. In the present embodiment, a reflecting plate 6 is disposed on the substrate 65 to cover the substrate 65 with the light emitting diodes 2 being exposed.

In the present embodiment, the light entrance surface 11 of the illuminating lens 1 and the bottom surface 13 surrounding the light entrance surface 11 are on the same level.

The lighting device 7 emits light to one surface 4a of the diffusing plate 4. That is, the one surface 4a of the diffusing plate 4 is the surface to be irradiated 3 that has been described in the first and second embodiments. The diffusing plate 4 emits the light received on its one surface 4a from the other surface 4b in a diffused manner. The lighting devices 7 emit light individually toward a large area of the one surface 4a of the diffusing plate 4 so that the one surface 4a has a uniform illuminance, and upon receiving this light, the diffusing plate 4 emits the light diffusely. As a result, the surface light source capable of emitting light having less uneven brightness in the plane is obtained.

The light emitted from the lighting device 7 is diffused by the diffusing plate 4 so that the diffuse light returns to the lighting device side or passes through the diffusing plate 4. The light that has returned to the lighting device side and struck the reflecting plate 6 is reflected at the reflecting plate 6 and again enters the diffusing plate 4.

Figure 22:
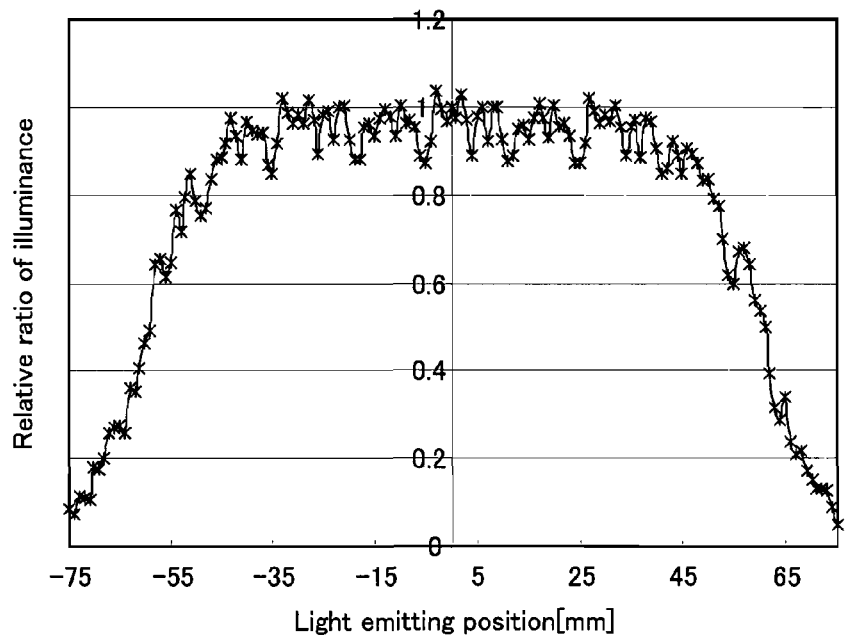
FIG. 22 shows an illuminance distribution obtained when the lighting device of Example 1 is used in the surface light source according to the third embodiment of the present invention.
Figure 23:
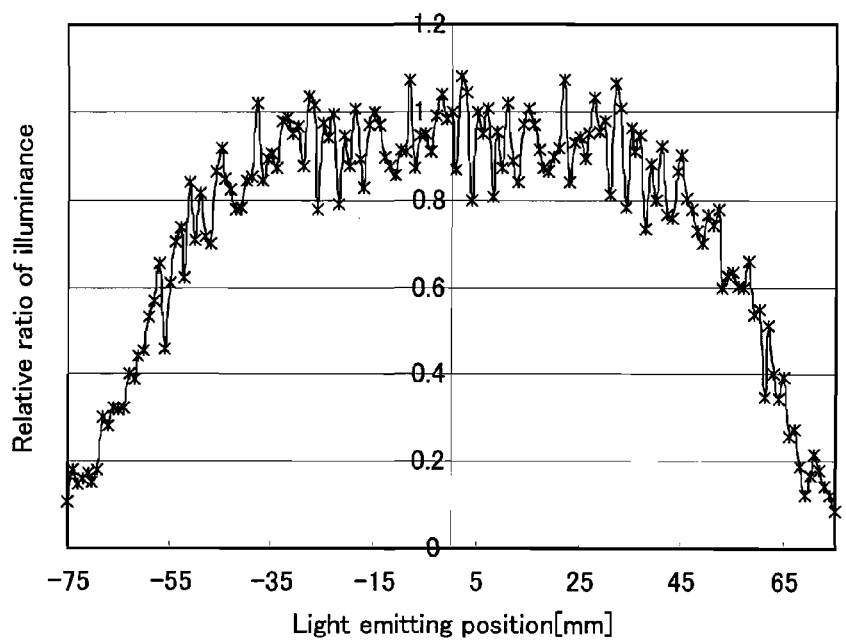
FIG. 23 shows an illuminance distribution obtained when the lighting device of Example 2 is used in the surface light source according to the third embodiment of the present invention.
Figure 24:
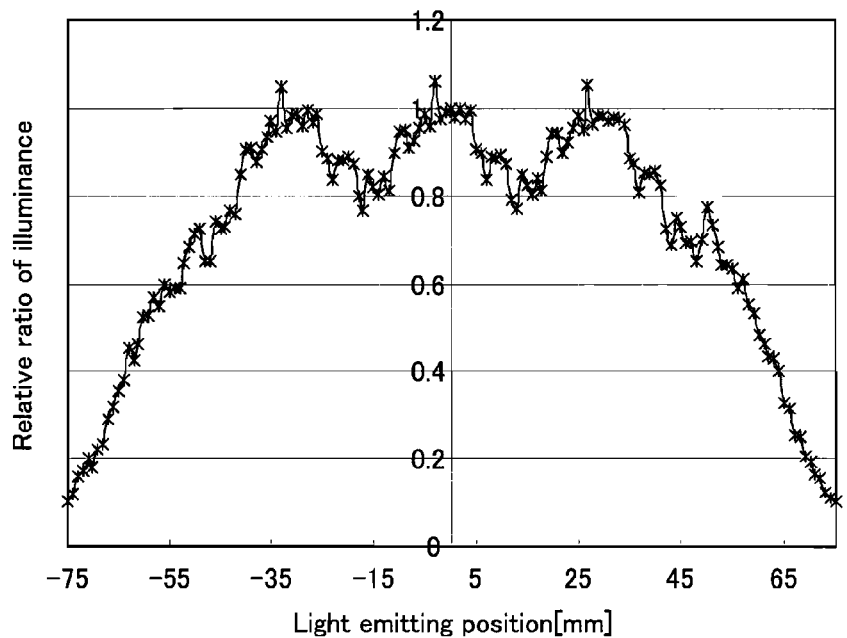
FIG. 24 shows an illuminance distribution obtained when the lighting device of Example 3 is used in the surface light source according to the third embodiment of the present invention.

FIG. 22 shows the illuminance distribution on the light entrance surface (one surface on the side of the lighting device) of the diffusing plate obtained by calculation assuming that four lighting devices of Example 1 each including the illuminating lens in FIG. 10 and the light emitting diode are arranged in a line at a pitch of 20 mm and the diffusing plate is placed at a distance of 8 mm from the light emitting diodes. Small fluctuations in the illuminance distribution are attributed to a small number of light rays to be evaluated in calculating the illuminances. FIG. 23 and FIG. 24 show the illuminance distribution obtained in the same manner when the lighting devices of Example 2 are used and the illuminance distribution obtained when the lighting devices of Example 3 are used, respectively.

Figure 25:
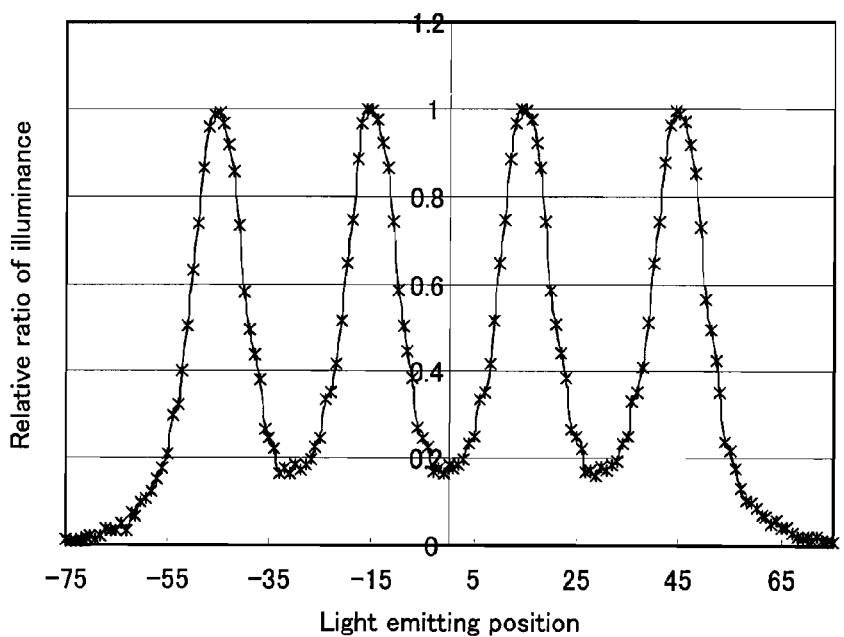
FIG. 25 shows an illuminance distribution obtained when a surface light source including lighting devices each composed of only a light emitting diode is used to confirm the effects of Examples 1 to 3.

FIG. 25 shows the illuminance distribution on the light entrance surface of the diffusing plate obtained by calculation assuming that four light emitting diodes only are arranged in a line with a pitch of 20 mm and the diffusing plate is placed at a distance of 8 mm from the light emitting diodes.

A comparison between FIGS. 22 to 24 and FIG. 25 shows that the illuminating lens is effective in illuminating the light entrance surface of the diffusing plate uniformly.

Fourth Embodiment

Figure 26:
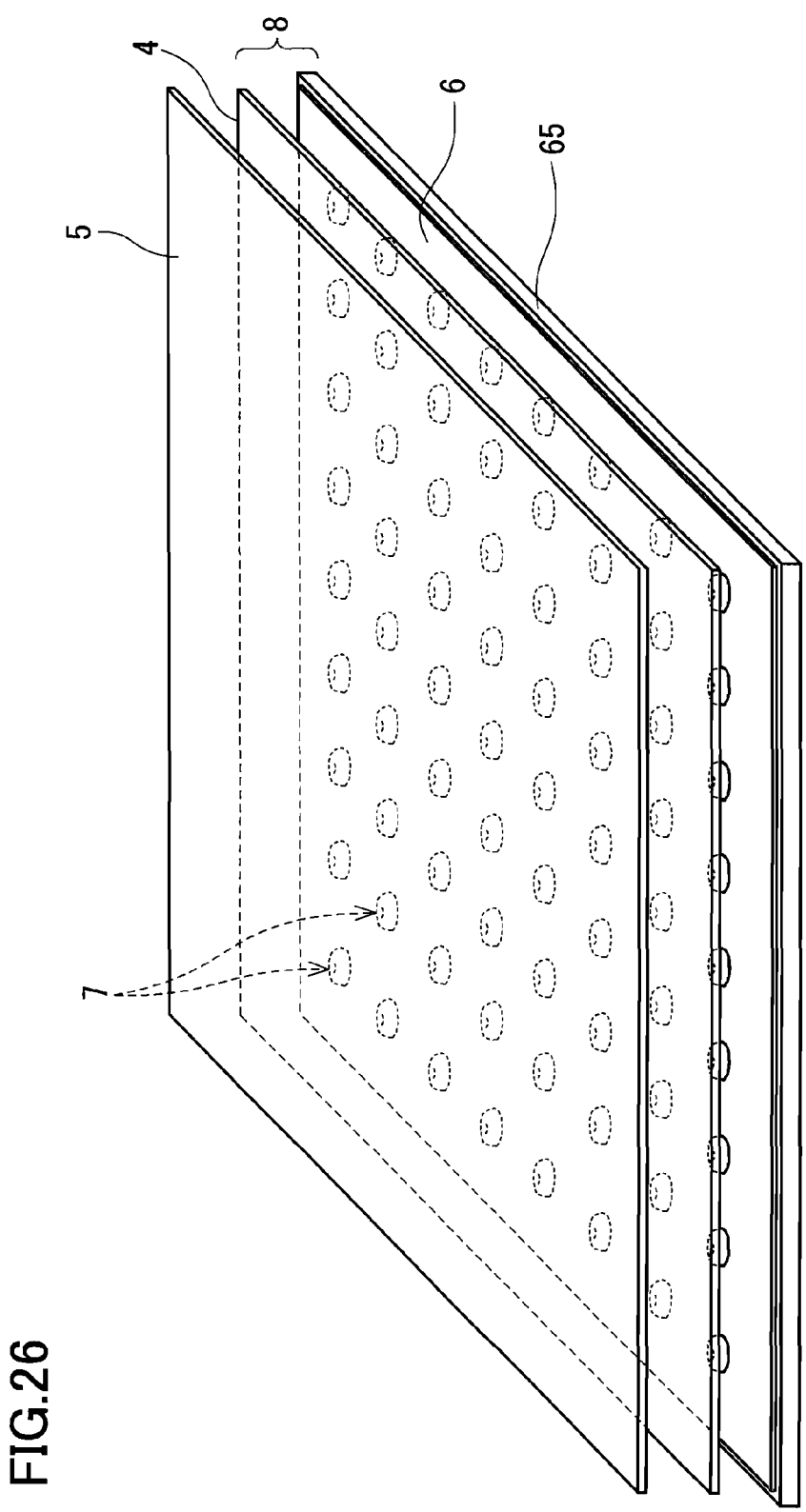
FIG. 26 is a schematic diagram of a liquid-crystal display apparatus according to a fourth embodiment of the present invention.

FIG. 26 is a schematic diagram of a liquid-crystal display apparatus according to a fourth embodiment of the present invention. This liquid-crystal display apparatus includes a liquid-crystal panel 5, and a surface light source 8 of the third embodiment disposed behind the liquid-crystal panel 5.

A plurality of lighting devices 7 each including the light emitting diode 2 and the illuminating lens 1 are arranged in a plane, and the diffusing plate 4 is illuminated by these lighting devices 7. The underside (one surface) of the diffusing plate 4 is irradiated with the light emitted from the lighting devices 7 to have a uniform illuminance, and then the light is diffused by the diffusing plate 4. Thus, the liquid-crystal panel 5 is illuminated by the diffused light.

It is preferable that an optical sheet such as a diffusing sheet or a prism sheet is disposed between the liquid-crystal panel 5 and the surface light source 8. In this case, the light that has passed through the diffusing plate 4 further is diffused by the optical sheet and illuminates the liquid-crystal panel 5.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An illuminating lens for spreading light emitted from a light source so that a surface to be irradiated is irradiated with the spread light, the lens comprising:

a light entrance surface through which the light emitted from the light source enters the lens; and a light exit surface through which the light that has entered the lens exits the lens, wherein the light exit surface has a first light exit surface and a second light exit surface, the first light exit surface being recessed toward a point on an optical axis of the illuminating lens, and the second light exit surface extending outwardly from a periphery of the first light exit surface to form a convex, the first light exit surface has a transmissive region located in the center of the first light exit surface and a total reflection region located around the transmissive region, the transmissive region being capable of transmitting light that has been emitted from a starting point at a relatively small angle with respect to the optical axis and then reached the first light exit surface, when a position of the light source on the optical axis is defined as the starting point, and the total reflection region being capable of totally reflecting light that has been emitted from the starting point at a relatively large angle with respect to the optical axis and then reached the first light exit surface, and the second light exit surface has a shape capable of transmitting approximately the entire amount of light that has been emitted from the starting point and then reached the second light exit surface, wherein the light exit surface is rotationally symmetric with respect to the optical axis.

2. The illuminating lens according to claim 1, wherein the light source is a point light source and the light entrance surface has a shape conforming to the shape of the point light source.

3. The illuminating lens according to claim 1, wherein when an angle between the optical axis and a line connecting the starting point and a boundary between the first light exit surface and the second light exit surface is defined as θb, the following inequality is satisfied:

$$20 \text{ degrees} < \theta b < 40 \text{ degrees}.$$

4. The illuminating lens according to claim 1, wherein the entire second light exit surface transmits the light that has been emitted from the starting point.

5. The illuminating lens according to claim 1, wherein the second light exit surface totally reflects a part of the light that has been emitted from the starting point and transmits the remaining part of the light.

6. The illuminating lens according to claim 1, wherein when a thickness of the illuminating lens on the optical axis is denoted as d', and an outermost radius of the illuminating lens is denoted as R, the following inequality is satisfied:

$d'/2R<0.25$, and in the case where the surface to be irradiated is illuminated via the illuminating lens, when a distribution width of illuminances of 0.2 or more in an illuminance distribution curve on the surface to be irradiated is denoted as $\delta_L$, the illuminance distribution curve being obtained by normalizing illuminances with respect to an illuminance at the center of the optical axis being 1, and in the case where the surface to be irradiated is illuminated only by the light source, when a distribution width of illuminances of 0.2 or more in an illuminance distribution curve on the surface to be irradiated is denoted as $\delta_S$, the illuminance distribution curve being obtained by normalizing illuminances with respect to an illuminance at the center of the optical axis being 1, the following inequality is satisfied:

$2.0<\delta_L/\delta_S<4.0$.

7. A lighting device comprising:
a light emitting diode for emitting light; and
an illuminating lens for spreading light emitted from the light emitting diode so that a surface to be irradiated is irradiated with the spread light,
wherein the illuminating lens is the illuminating lens according to claim 1.

8. A surface light source comprising:
a plurality of lighting devices arranged in a plane; and
a diffusing plate disposed to cover the plurality of lighting devices, the diffusing plate being configured to receive on one surface thereof light emitted from the plurality of lighting devices and to emit the light from the other surface thereof in a diffused manner,
wherein each of the plurality of lighting devices is the lighting device according to claim 7.

9. The surface light source according to claim 8, further comprising:
a substrate on which the light emitting diode included in each of the plurality of lighting devices is mounted, the substrate facing the diffusing plate with the plurality of lighting devices being disposed therebetween; and
a reflecting plate disposed on the substrate to cover the substrate with the light emitting diodes being exposed.

10. A liquid-crystal display apparatus comprising:
a liquid-crystal panel; and
the surface light source according to claim 8 disposed behind the liquid-crystal panel.

11. An illuminating lens for spreading light emitted from a light source so that a surface to be irradiated is irradiated with the spread light, the lens comprising:
a light entrance surface through which the light emitted from the light source enters the lens; and
a light exit surface through which the light that has entered the lens exits the lens,
wherein the light exit surface has a first light exit surface and a second light exit surface, the first light exit surface being recessed toward a point on an optical axis of the illuminating lens, and the second light exit surface extending outwardly from a periphery of the first light exit surface to form a convex,
the first light exit surface has a transmissive region located in the center of the first light exit surface and a total reflection region located around the transmissive region, the transmissive region being capable of transmitting light that has been emitted from a starting point at a relatively small angle with respect to the optical axis and then reached the first light exit surface, when a position of the light source on the optical axis is defined as the starting point, and the total reflection region being capable of totally reflecting light that has been emitted from the starting point at a relatively large angle with respect to the optical axis and then reached the first light exit surface, and
the second light exit surface has a shape capable of transmitting approximately the entire amount of light that has been emitted from the starting point and then reached the second light exit surface,
wherein when a point of intersection of the first light exit surface and the optical axis is denoted as C, a point on a boundary between the transmissive region and the total reflection region is denoted as P, a distance between the point C and the starting point is denoted as d, an angle between the optical axis and a line connecting the point P and the starting point is denoted as θp, and a length of a straight line connecting the point C and the point P is denoted as a, the following inequality is satisfied:

$1.10<a/(d\times\tan\theta p)<1.30$.

12. An illuminating lens for spreading light emitted from a light source so that a surface to be irradiated is irradiated with the spread light, the lens comprising:
a light entrance surface through which the light emitted from the light source enters the lens; and
a light exit surface through which the light that has entered the lens exits the lens,
wherein the light exit surface has a first light exit surface and a second light exit surface, the first light exit surface being recessed toward a point on an optical axis of the illuminating lens, and the second light exit surface extending outwardly from a periphery of the first light exit surface to form a convex,
the first light exit surface has a transmissive region located in the center of the first light exit surface and a specular reflection region located around the transmissive region, the transmissive region being capable of transmitting light that has been emitted from a starting point at a relatively small angle with respect to the optical axis and then reached the first light exit surface, when a position of the light source on the optical axis is defined as the starting point, and the specular reflection region being covered with a reflective layer capable of specularly reflecting light that has been emitted from the starting point at a relatively large angle with respect to the optical axis and then reached the first light exit surface, and
the second light exit surface has a shape capable of transmitting approximately the entire amount of light that has been emitted from the starting point and then reached the second light exit surface.

13. The illuminating lens according to claim 12, wherein the specular reflection region has a shape capable of totally reflecting the light that has been emitted from the starting point at the relatively large angle with respect to the optical axis and then reached the first light exit surface when the specular reflection region is not covered with the reflective layer.

14. The illuminating lens according to claim 12, wherein the light exit surface is rotationally symmetric with respect to the optical axis.

* * * * *